United States Patent [19]
Yagi et al.

[11] Patent Number: 6,142,791
[45] Date of Patent: Nov. 7, 2000

[54] CONSTRUCTION FOR MOUNTING ELECTRONIC COMPONENT ON FLEXIBLE SUBSTRATE

[75] Inventors: Nobuyuki Yagi; Shigeaki Kinoshita; Noboru Tohma; Osamu Nomura; Ikuo Nagatomo; Mitsuru Hosokawa, all of Kanagawa-ken, Japan

[73] Assignee: Teikoku Tsushin Kogyo Co., Ltd., Kawasaki, Japan

[21] Appl. No.: 09/115,647

[22] Filed: Jul. 15, 1998

[30] Foreign Application Priority Data

| Jul. 16, 1997 | [JP] | Japan | 9-208572 |
| Nov. 20, 1997 | [JP] | Japan | 9-337979 |
| Dec. 26, 1997 | [JP] | Japan | 9-369027 |

[51] Int. Cl.$^7$ ............................................. H01R 12/00
[52] U.S. Cl. ........................................................ 439/67
[58] Field of Search ................... 439/67, 77, 68, 439/73; 361/772, 774, 776, 760; 29/835; 174/254, 260; 257/785, 723, 726, 727

[56] References Cited

U.S. PATENT DOCUMENTS

| H921 | 5/1991 | Wannemacher, Jr. | 361/760 |
| 3,843,951 | 10/1974 | Maheux . | |
| 4,575,038 | 3/1986 | Moore | 248/316.7 |
| 5,042,971 | 8/1991 | Ambrose . | |
| 5,057,023 | 10/1991 | Kabadi et al. . | |
| 5,112,249 | 5/1992 | Henry et al. | 439/581 |
| 5,130,888 | 7/1992 | Moore | 361/717 |
| 5,446,623 | 8/1995 | Kanetake | 361/760 |
| 5,825,629 | 10/1998 | Hoebener et al. | 361/777 |

FOREIGN PATENT DOCUMENTS

| 0 339 701 | 11/1989 | European Pat. Off. . |
| 85 29 689 | 12/1985 | Germany . |
| 9-64505 | 3/1997 | Japan . |

*Primary Examiner*—Steven L. Stephan
*Assistant Examiner*—Barry M. L. Standig
*Attorney, Agent, or Firm*—Wenderoth, Lind & Ponack, L.L.P.

[57] ABSTRACT

The invention provides a mounting construction in which an electronic component is mounted on a flexible substrate. The mounting construction comprises a flexible substrate including a flexible sheet, bendable electrode pattern forming portions formed on the flexible sheet, and electrode patterns formed on the electrode pattern forming portions, an electronic component having electrode portions, and a clamping member having clamping pieces for clamping the electronic component therebetween. The electrode pattern forming portions are deflected, so as to cause the electrode patterns to be contacted with the electrode portions of the electronic component placed on the flexible substrate. By this, the electronic component is clamped by the clamping pieces of the clamping member through the deflected electrode pattern forming portions. Thus, the electronic component may be easily and positively secured to the flexible substrate, without employing additional reinforcing means such as adhesives.

31 Claims, 21 Drawing Sheets

CONSTRUCTION FOR MOUNTING ELECTRONIC COMPONENT ON FLEXIBLE SUBSTRATE

BACKGROUND OF THE INVENTION

This invention relates to a construction for mounting an electronic component on a flexible substrate.

Conventionally, soldering or cold soldering techniques have been used, for allowing electrode portions of an electronic component of the chip type to be connected to a circuit pattern which has been formed by etching a copper foil disposed on a flexible substrate. Specifically, soldering cream is printed on a flexible substrate. Then, an electronic component of the chip type is placed on the soldering cream by means of an automatic mounting machine. Subsequently, the flexible substrate is directed into a heating furnace so as to cause the electronic component to be soldered on the flexible substrate.

It is noted that, since the flexible substrate tends to be easily deflected, sufficient connection strength is not obtained when the connection is performed by merely using a soldering operation. Thus, a U. V. curable adhesive is applied on the electronic component so as to encapsulate the electronic component. The thus encapsulated electronic component is directed into a U. V. irradiation furnace so as to be cured therein for the purpose of reinforcement.

When the circuit pattern is formed by printing silver paste on the flexible substrate, a problem regarding adhesive properties is caused, in contrast to the circuit pattern formed by etching a copper foil. Thus, a conductive adhesive of a hot melt type is conventionally used in place of a solder. It is also necessary to use a conductive adhesive, when a film having a low heat-resistive temperature (for example, polyethylene terephthalate (PET) film) is used as a flexible substrate.

In this case, a conductive adhesive is printed on the flexible substrate and then dried. An electronic component is placed on the conductive adhesive by means of an automatic mounting machine. Thereafter, the flexible substrate and the electronic component are heated and compressed together, so as to cause the conductive adhesive to melt, whereby the flexible substrate and the electronic component are connected together.

It is also noted that, in this case, not sufficient connection strength between the flexible substrate and the electronic component is obtained. Thus, a U. V. curable adhesive is applied on the electronic component so as to encapsulate it.

In any of the connection methods mentioned above, and when a large number of electronic components are to be mounted on a flexible substrate, the flexible substrate having mounted thereon the electronic components may be directed into a heating furnace or U. V. irradiation furnace, so as to cause the electronic components to be efficiently connected at one time.

It is noted, however, that, when a small number of electronic components are to be mounted on a flexible substrate, production efficiency is reduced. This is because that, even when a small number of electronic components are to be mounted on a flexible substrate, it is necessary for the electronic components to be mounted on the flexible substrate and directed into a heating furnace so as to cause the electronic components to be connected to the flexible substrate. Furthermore, it is necessary for the electronic components to be applied with a U. V. curable adhesive and directed into a U. V. irradiation furnace.

Installation of a heating furnace or a U. V. irradiation furnace also increases the cost of equipment.

In order to solve the above-mentioned problems, it is contemplated for individual electronic components to be mounted one by one on a flexible substrate, without using a heating furnace or the like. It is noted, however, that such a construction has not been proposed heretofore which facilitates simple and easy mounting of electronic components on a flexible substrate.

SUMMARY OF THE INVENTION

It is therefore one object of the invention to provide a mounting construction in which an electronic component may be easily and reliably mounted on a flexible substrate.

It is another object of the invention to provide a mounting construction in which an electronic component may be mounted on a flexible substrate, without causing an excessive load or damage relative to the electronic component.

According to the invention, the mounting construction comprises a flexible substrate including a flexible sheet, bendable electrode pattern forming portions formed on the flexible sheet, and electrode patterns formed on the electrode pattern forming portions, an electronic component having electrode portions, and a clamping member having clamping pieces for clamping the electronic component therebetween. The electrode pattern forming portions are deflected, so as to cause the electrode patterns to be contacted with the electrode portions of the electronic component placed on the flexible substrate. By this, the electronic component is clamped by the clamping pieces of the clamping member through the deflected electrode pattern forming portions.

With the above-mentioned construction, the electronic component may be mounted on the flexible substrate by means of a mechanical clamping means. This facilitates easy mounting of the electronic component on the flexible substrate, and eliminates the use of a heating furnace or U. V. irradiation furnace during mounting of the electronic component on the flexible substrate. Thus, production efficiency may be improved, even when a smaller number of electronic components are mounted on a flexible substrate. Production equipment such as a heating furnace may also be eliminated, thus reducing production costs.

Since the electronic component and the electrode pattern forming portions of the flexible substrate are clamped by a clamping member, the electronic component may be reliably secured on the flexible substrate, without using additional adhesives for the purpose of reinforcement.

In another aspect of the invention, the clamping member is formed from a resilient metal plate. The metal plate is bent, at its opposite sides, into a predetermined configuration, so that the bent opposite sides serve as the clamping pieces.

In another aspect of the invention, the clamping member is formed with guide lugs. The guide lugs are adapted to be upstandingly extended through the flexible substrate.

With the above-mentioned construction, and when the guide lugs are inserted into the flexible substrate, the clamping member may be properly positioned relative to the flexible substrate. It is also noted that the electronic component or the portions of the clamping member, by which the electronic component is clamped, are prevented from being directly contacted by another member, so that the electronic component may be mounted more stably.

In another aspect of the invention, the clamping member is formed with presser portions which tend to urge the clamping pieces to their open positions.

With the above-mentioned construction, excessive force or damage relative to the electronic component may be prevented, when the electronic component is mounted on the flexible substrate.

In another aspect of the invention, the flexible substrate is formed, at a portion which is not clamped by the clamping member, with an insulating layer having a predetermined thickness.

With the above-mentioned construction, slidable movement of the electronic component toward a position, at which the electronic component is not clamped by the clamping member, may be reliably prevented, thus eliminating misalignment of the electronic component.

In another aspect of the invention, the electronic component, with the lower surface thereof facing upwardly, may be mounted on the flexible substrate and clamped by the clamping pieces of the clamping member, when the electrode portions of the electronic component are formed from a metal plate, which extends from a casing of the electronic component along the outer surface of the casing and are bent toward the lower surface of the casing.

With the above-mentioned construction, the electronic component may be easily and reliably mounted on the flexible substrate, without causing the clamping pieces to be opened to a substantial degree.

In another aspect of the invention, the clamping pieces of the clamping member are formed by bending a resilient metal plate, at its opposite ends, into a predetermined configuration, while providing a positioning hole in the resilient metal plate at its center.

With the above-mentioned construction, the clamping member may be appropriately positioned relative to a push-up member, on which the clamping member is placed, when the clamping pieces of the clamping member are to be opened. Thus, the clamping pieces may be reliably opened.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE PREFERRED EMBODIMENTS

Several embodiments of the invention will be explained below with reference to the attached drawings.

[First Embodiment]

Figure 1:
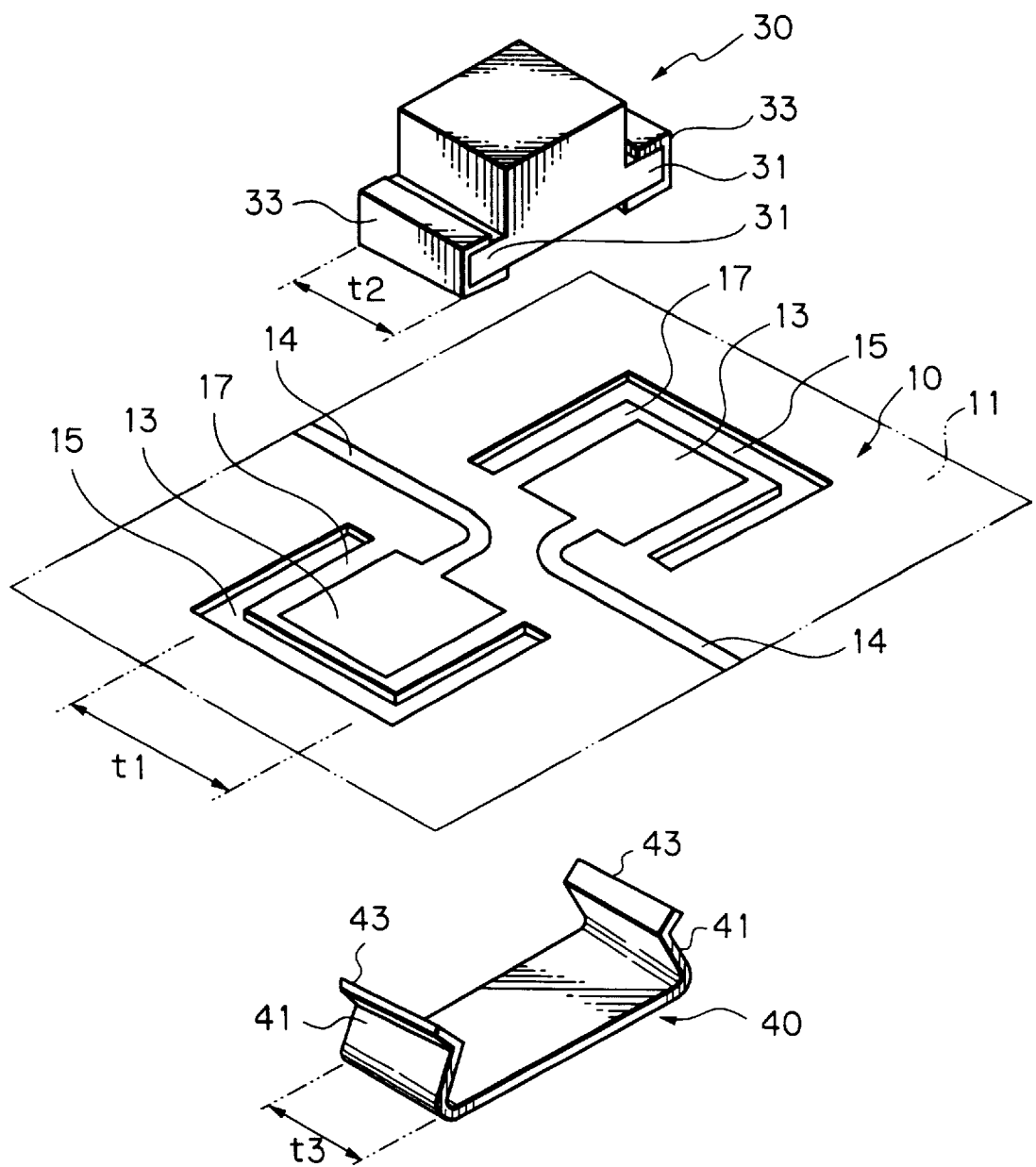
FIG. 1 is a schematic exploded perspective view showing a first embodiment according to the invention.

FIG. 1 is an exploded perspective view showing the main portion of a construction in which an electronic component is mounted on a flexible substrate in accordance with a first embodiment of the invention. In this embodiment, a flexible substrate 10 and an electronic component 30 are mechanically and electrically connected and secured relative to one another by means of a clamping member 40, as shown in FIG. 1. Each component part will be explained below.

The flexible substrate 10 is comprised of a synthetic resin film (for example, a flexible sheet made of PET) 11, and electrode patterns 13, 13 formed on the surface of the synthetic resin film 11. A notch or cut out portion 15 is formed which circumscribes three sides of a respective electrode pattern 13, whereby an electrode pattern forming portion 17 of a tongue-like configuration is provided. In this connection, it is noted that the width ti of each of the electrode pattern forming portions 17 and 17 is selected to be slightly larger than the width t2 of the electronic component 30.

Each electrode pattern 13 is formed, together with a respective circuit pattern 14 leading out from a respective electrode pattern 13, by providing silver paste on the substrate by means of screen printing.

In the illustrated embodiment, the electronic component 30 is a light emitting diode. An electrode portion 33 is formed on the lower surface, the side surface and the upper surface of a protrusion 31 extending outwardly from each side of the electronic component. The electrode portions 33 and 33 may be formed by applying metal foil on the above-mentioned surfaces of the protrusion, or by means of metal plating.

The clamping member 40 is formed by bending a resilient metal plate of a rectangular configuration at its opposite sides, so as to form clamping pieces 41 and 41. In this connection, it is noted that the clamping pieces 41 and 41 are bent into a position slightly inward of the vertical plane. Specifically, the clamping pieces 41 and 41 are bent to an angle more than 90 degrees. The top edge 43 of each of the clamping pieces 41 and 41 is bent in the opposite direction so as to be opened outwardly. It is noted that the width t3 of the clamping member 40 is slightly smaller than the width t2 of the electronic component 30.

When the electronic component 30 is to be mounted on the flexible substrate 10, the electronic component 30 is first placed on the flexible substrate 10 so that the electrode patterns 13 and 13 are connected respectively with the lower surfaces of the electrode portions 33 and 33. No material such as an adhesive or a solder is placed between the electrode patterns 13 and 13 and the lower surfaces of the electrode portions 33 and 33.

Then, the clamping member 40 is pushed upwardly from the rear-side surface of the flexible substrate 10. By this, the electrode pattern forming portions 17 and 17 are deflected upwardly by means of the clamping pieces 41 and 41 of the clamping member 40, so as to be wound around a respective protrusion 31 of the electronic component 30, whereby the electronic component 30 is resiliently clamped. By this, the electrode portions 33 and 33 of the electronic component 30 and the corresponding electrode pattern forming portions 17 and 17 are pressed and connected together, whereby mounting of the electronic component 30 is completed.

Figure 2:
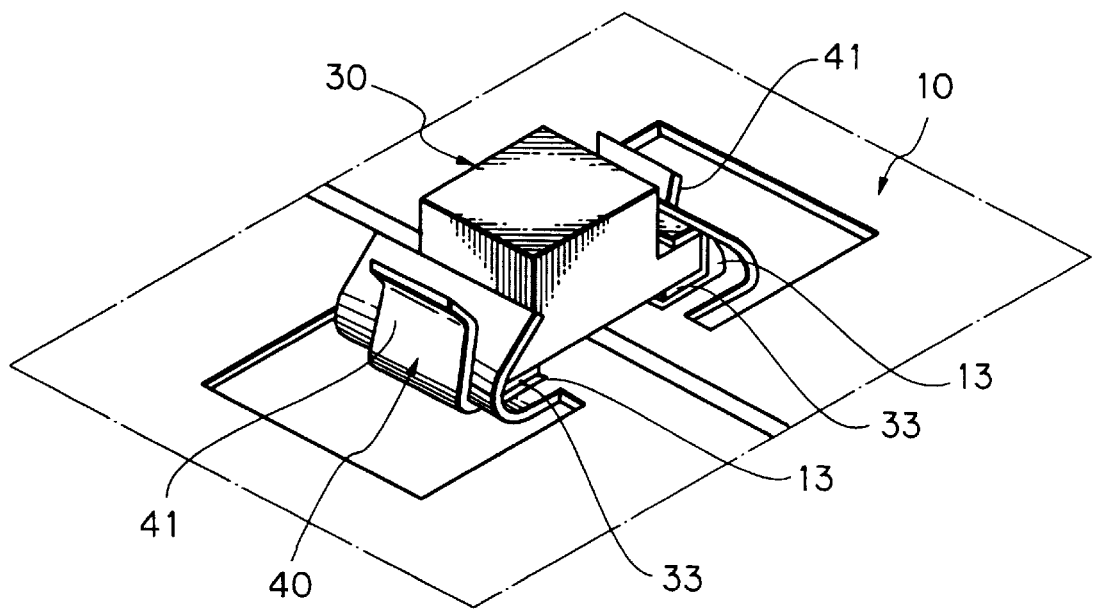
FIG. 2 is a schematic perspective view showing an electronic component 30 mounted on a flexible substrate 10.
Figure 3:
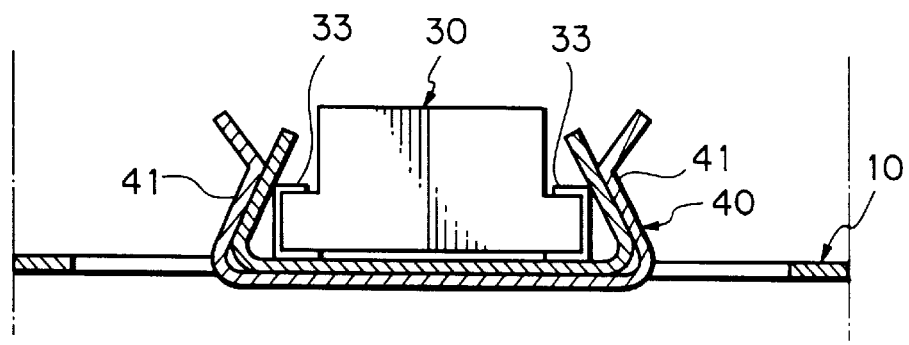
FIG. 3 a side sectional view showing the electronic component 30 mounted on the flexible substrate 10.

FIG. 2 is a schematic perspective view showing the electronic component 30 having been mounted on the flexible substrate 10 in the above-mentioned manner. FIG. 3 is a side sectional view of FIG. 2.

As shown in FIGS. 2 and 3, the electrode patterns 13 and 13 formed on the flexible substrate 10 are urged against the corresponding electrode portions 33 and 33 of the electronic component 30 by means of the clamping pieces 41 and 41 of the clamping member 40. Thus, the flexible substrate 10 and the electronic component 30 are electrically and mechanically secured together in a positive manner.

In the illustrated embodiment, the width t1 (refer to FIG. 1) of each of the electrode forming portions 17 is selected to be greater than the width t3 of the clamping member 40, in order to securely prevent the clamping member 40, which is made of a conductive metal, from contacting directly with the electrode portions 33 of the electronic component 30, so as to eliminate any occurrence of a short circuit by means of the clamping member 40.

[Second Embodiment]

Figure 4:
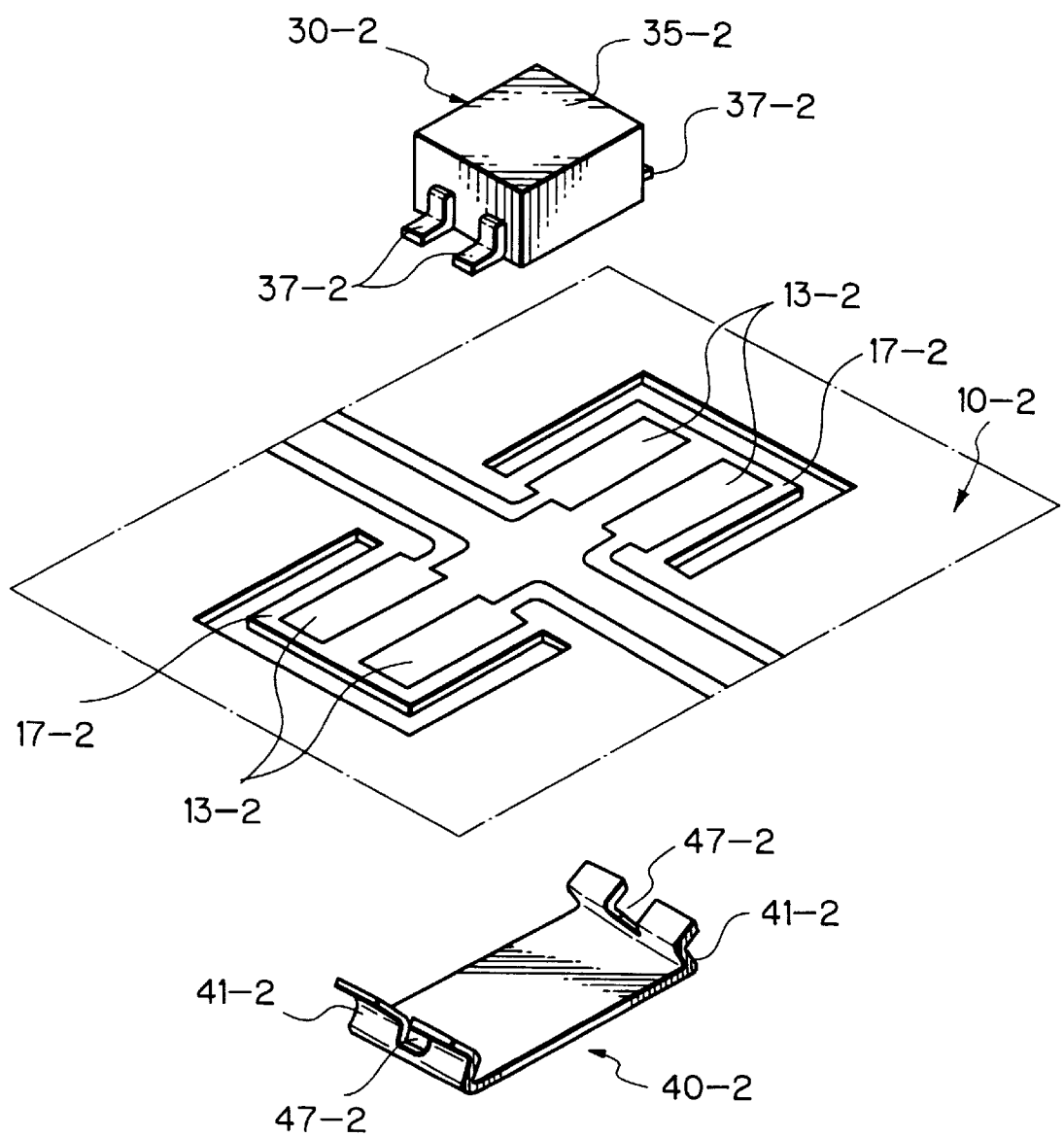
FIG. 4 is a schematic exploded perspective view showing a second embodiment according to the invention.
Figure 5:
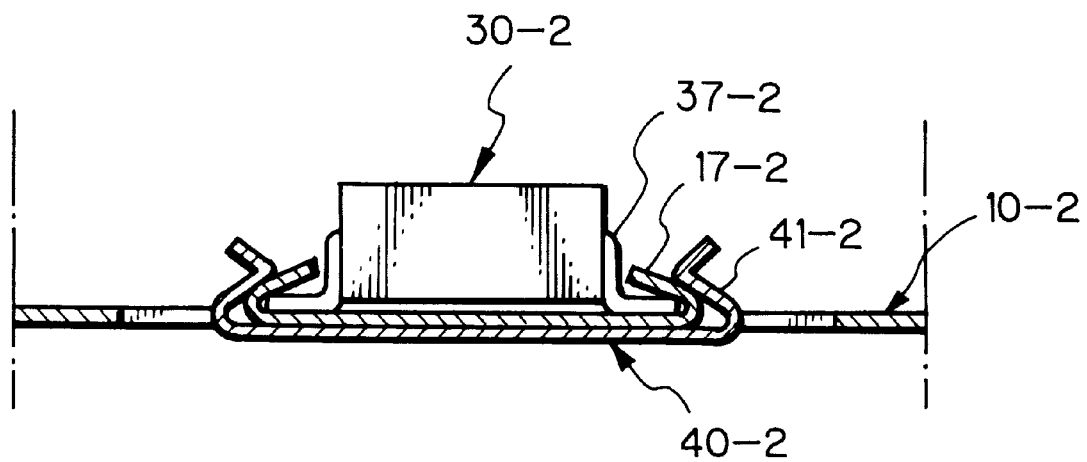
FIG. 5 is a side sectional view showing an electronic component 30-2 mounted on a flexible substrate 10-2.

FIG. 4 is a schematic exploded perspective view showing a second embodiment of the invention. FIG. 5 is a side sectional view showing an electronic component 30-2 mounted on a flexible substrate 10-2. This embodiment is different from the first embodiment by the construction of the electronic component 30-2, and the configuration of the flexible substrate 10-2 and the clamping member 40-2 having been modified in accordance with the construction of the electronic component 30-2.

That is to say, the electronic component 30-2 of this embodiment is a chip type diode array. The electronic component 30-2 includes a resin-encapsulated casing 35-2, and two electrode portions 37-2 of a metal plate protruding from each side surface of the casing 35-2.

Thus, four electrode patterns 13-2 are provided on the flexible substrate 10-2, in accordance with the number of the electrode portions 37-2.

Clamping pieces 41-2 and 41-2 of a clamping member 40-2 are each divided into two sections by means of a respective slit 47-2.

In this embodiment, like the first embodiment, the electronic component 30-2 is placed on the flexible substrate 10-2. Then, the clamping member 40-2 is pushed upwardly from the rear-side surface of the flexible substrate 10-2. By this, the opposite electrode pattern forming portions 17-2 and 17-2 are deflected in the upward direction by means of the clamping pieces 41-2 and 41-2 of the clamping member 40-2, and wound around a respective electrode portion 37-2 of the electronic component 30-2. By this, the electronic component is resiliently clamped.

Each clamping piece 41-2 is divided into two sections by means of a respective slit 47-2, so as to cause the electrode portions 37-2 to be separately and securely clamped, whereby the electrode portions may be securely clamped regardless of any variation in thickness and length of the electrode portions 37-2, thus providing reliable connection therebetween.

It is noted that, in accordance with the construction of the first embodiment, the electronic component 30 may be easily mounted on the flexible substrate 10, while at the same time eliminating the use of a heating furnace or U. V. irradiation furnace during mounting of the electronic component 30 on the flexible substrate 10. Thus, an improved production efficiency may be obtained even when a small number of electronic components 30 are mounted on the flexible substrate 10.

It is also noted that the electronic component 30 may be positively secured on the flexible substrate, thus obviating any additional reinforcing means such as adhesives.

It is noted, however, that, in the construction according to the first embodiment, the clamping pieces 41 and 41 of the clamping member 40 are forcibly opened by means of the electrode portions 33 and 33 of the electronic component 30 when the clamping member 40 is attached to the electronic component 30. By this, an increased load is undesirably applied to the electrode portions 33 and 33. This may cause the electrode portions 33 and 33 to be damaged.

It is also noted that, when the clamping member 40 is to be attached to the electronic component 30, it is necessary for the electronic component 30 to be pressed down on its upper portion by means of a jig (not shown), while the clamping member 40 is being pushed upwardly. Depending upon a given electronic component 30, breakage of elements or devices within the electronic component 30 may occur, when an excessive press-down force is applied to the electronic component. Similar problems may be caused in the second embodiment.

Embodiments to be explained below are intended to eliminate such a problem.

[Third Embodiment]

Figure 6:
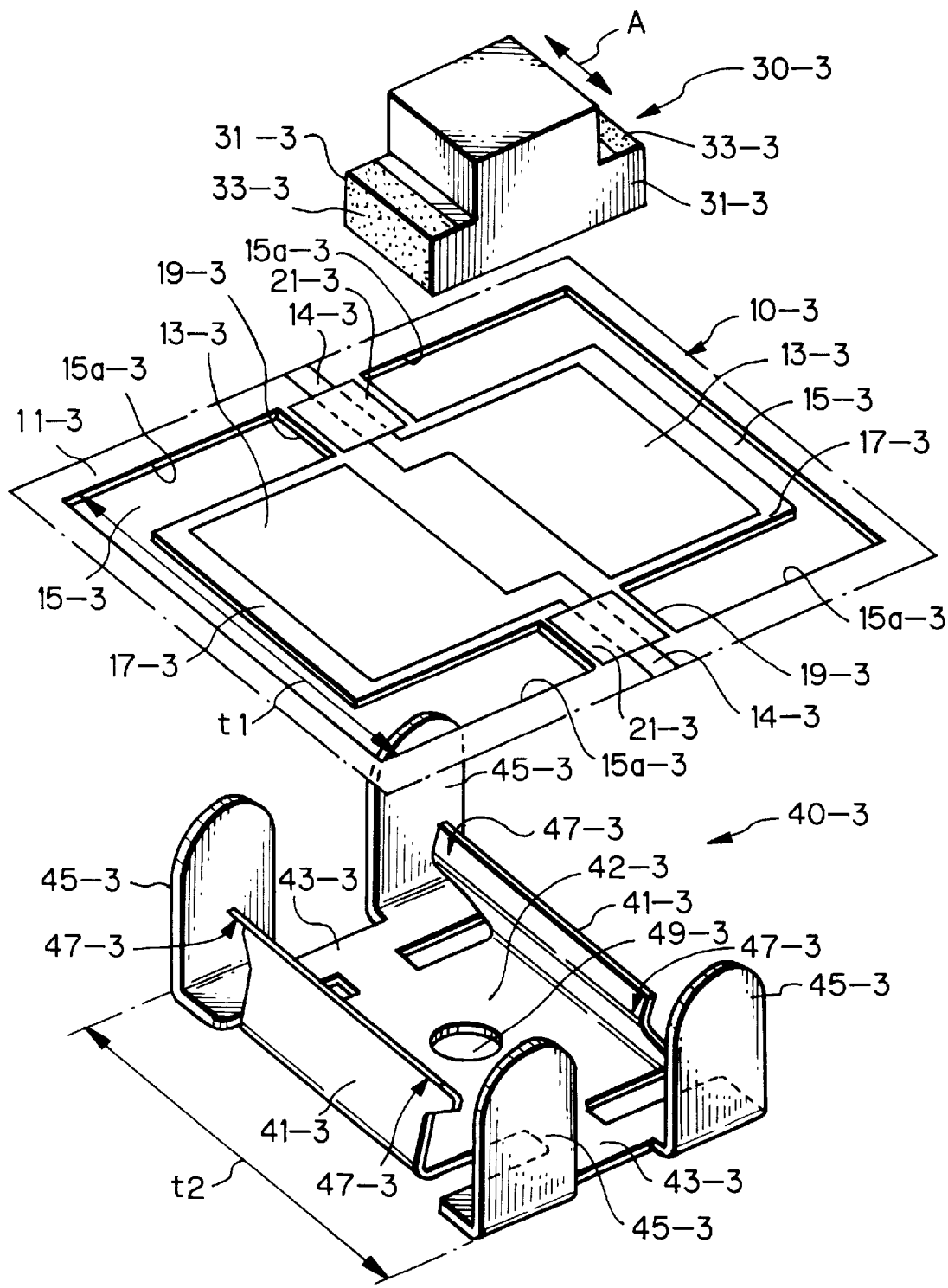
FIG. 6 is a schematic exploded perspective view showing a mounting construction according to a third embodiment of the invention in which an electronic component is mounted on a flexible substrate.

FIG. 6 is a schematic exploded perspective view showing a mounting construction in which an electronic component is mounted on a flexible substrate according to a third embodiment of the invention. In this embodiment, and as shown in FIG. 6, a flexible substrate 10-3 and an electronic component 30-3 are mechanically and electrically connected and secured together by means of a clamping member 40-3. Each component part will be explained below.

The flexible substrate 10-3 includes a synthetic resin film (for example, a flexible sheet of PET) 11-3, and two electrode patterns 13-3 and 13-3 formed on the surface of the synthetic resin film 11-3. A notch 15-3 is formed in the synthetic resin film 11-3 so as to circumscribe three peripheral sides of a respective electrode pattern 13-3. By this, electrode pattern forming portions 17-3 and 17-3 of a tongue-like configuration are provided.

It is noted that the electrode patterns 13-3 and 13-3, together with circuit patterns 14-3 and 14-3 leading out from the respective electrode patterns 13-3 and 13-3, have been formed by applying silver paste on the synthetic resin film using screen printing.

Insulation layers 21-3 and 21-3 are formed in the connection portions 19-3 and 19-3 at the proximal portions of the notches 15-3 and 15-3. The insulation layers 21-3 and 21-3 are formed by applying insulating paint on the connection portions 19-3 and 19-3 several times using screen printing. The thickness of the insulating layers 21-3 and 21-3 is selected to be approximately 100 micrometers.

The electronic component 30-3 according to this embodiment is a light emitting diode and has an outer configuration of a convex shape. Electrode portions 33-3 and 33-3 are formed on the lower surface, the side surface and the upper surface of protrusions 31-3 and 31-3 extending outwardly from the opposite sides of the electronic component.

Figure 7:
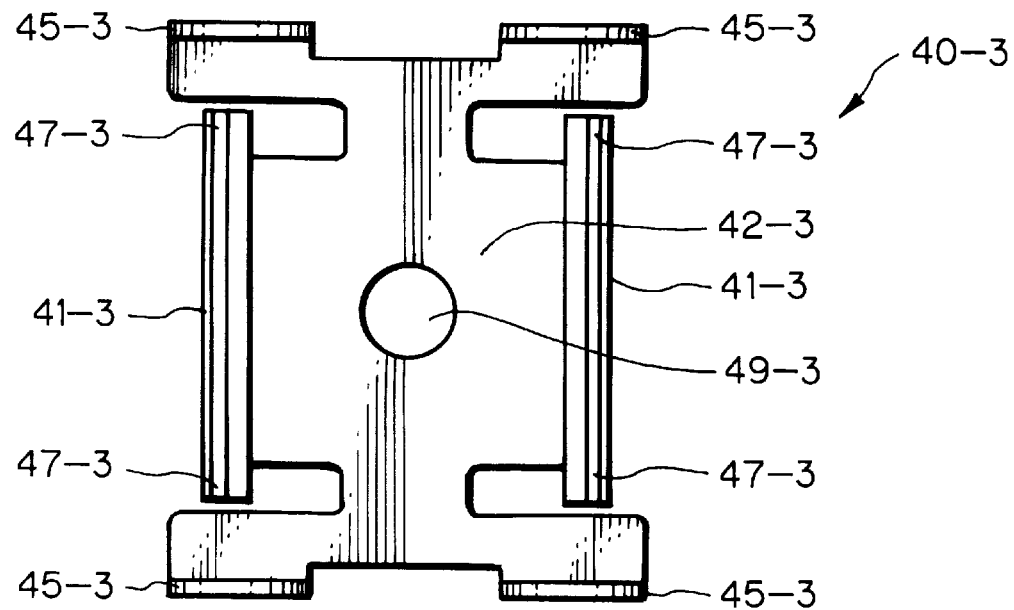
FIG. 7 is a plan view showing a clamping member 40-3.

The clamping member 40-3 includes a base portion 42-3 and clamping pieces 41-3 at opposite sides of the base portion, as shown in FIGS. 6 and 7. The clamping pieces 41-3 and 41-3 are formed by bending the opposite sides of the resilient metal plate in the upward direction. The clamping member 40-3 also includes a connection portion 43-3 of a T-shaped configuration extending from each side different from the sides on which the clamping pieces 41-3 and 41-3 are formed. The outer edge of each of the connection portions 43-3 and 43-3 is bent at its opposite ends in the upward direction, so as to form, in total, four guide lugs 45-3 of a tongue-like configuration.

It is noted that each of the clamping pieces 41-3 and 41-3 is configured to have a width at its forward end which is greater than that at its proximal end. The width of the forward end of the clamping piece is selected to be greater than that of the electrode pattern forming portions 17-3 and 17-3 of the flexible substrate 10-3. The opposite end portion of the forward end serve as a presser portion 47-3.

A width t2 between confronting guide lugs 45-3 is slightly smaller than the outer width t1 of the notches 15-3 and 15-3 formed in the flexible substrate 10-3. Each of the guide rugs 45-3 has a height which is slightly greater than the height of the clamping pieces 41-3 and the height of the electronic component 30-3. A positioning hole 49-3 is formed in the base portion 42-3 in its central portion.

Figure 8:
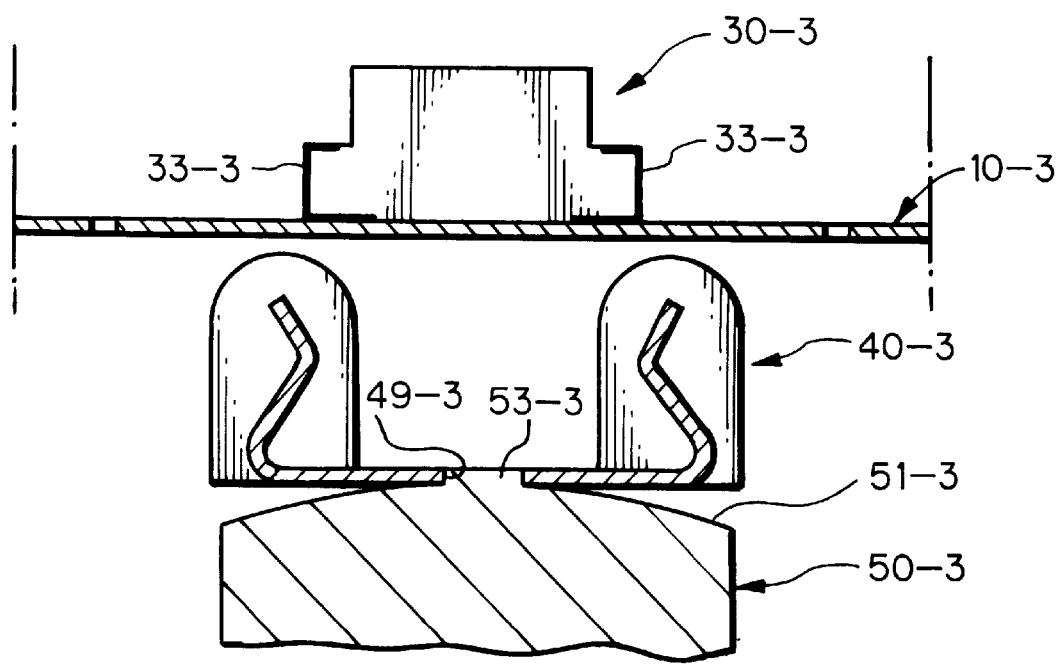
FIG. 8 is a side sectional view showing how an electronic component 30-3 is mounted on a flexible substrate 10-3 using clamping member 40-3.

When the electronic component 30-3 is to be mounted on the flexible substrate 10-3, the electronic component 30-3 is first placed on the flexible substrate 30-3, as shown in FIG. 8, so that the electrode patterns 13-3 and 13-3 (see FIG. 6) and the lower surfaces of the electrode portions 33-3 and 33-3 are bonded together (no adhesive or solder is placed therebetween). At the same time, the clamping member 40-3 placed on a push-up member 50-3 is disposed directly below the flexible substrate 10-3 mounted with the electronic component 30-3, as shown in FIG. 8. It is noted that a circular protrusion 53-3 at the central portion of the push-up member 50-3 has been inserted in the positioning hole 49-3 of the clamping member 40-3.

It is noted that the upper surface 51-3 of the push-up member 50-3 is curved into an arcuate configuration having a predetermined curvature.

Figure 9:
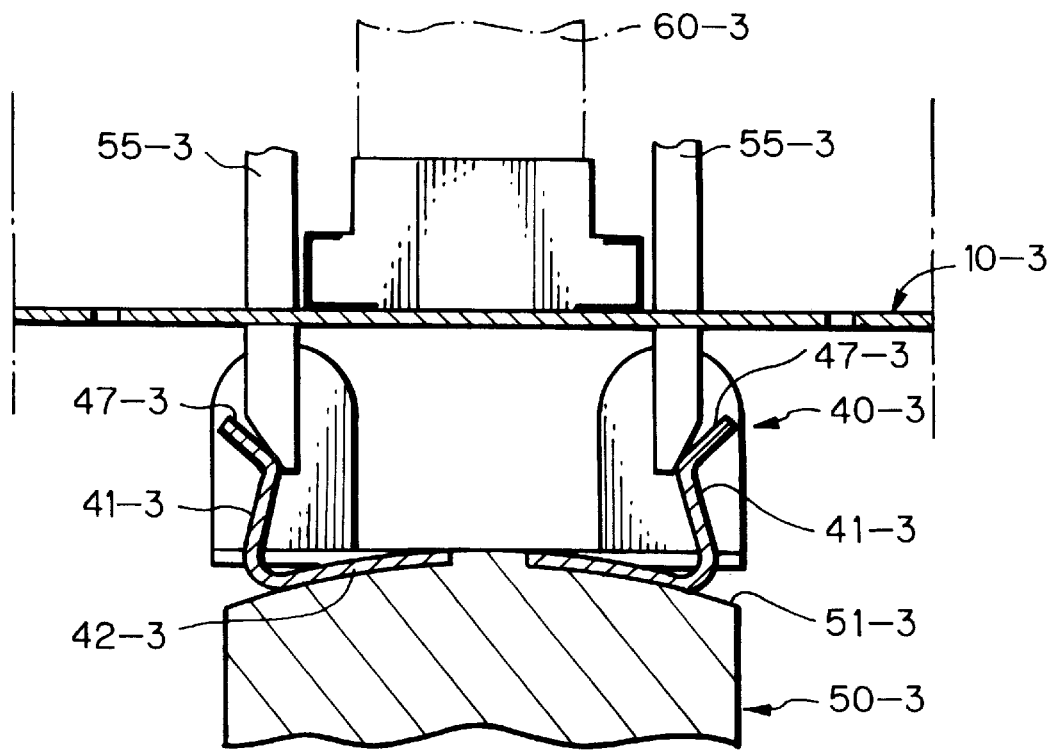
FIG. 9 is a side sectional view showing how electronic component 30-3 is mounted on flexible substrate 10-3 using clamping member 40-3.

Four presser protrusions 55-3 (only two rearward presser protrusions are shown in FIG. 9) are moved from the upper side of the flexible substrate 10-3 through the notches 15-3, as shown in FIG. 9. By this, the four presser portions 47-3 (refer to FIGS. 6 and 7) of the clamping pieces 41-3 and 41-3 of the clamping member 40-3 are depressed, so that the clamping pieces 41-3 and 41-3 are opened outwardly. At this time, the base portion 42-3 of the clamping member 40-3 is deflected into a configuration the same as that of the upper surface 51-3 of the push-up member 50-3.

Figure 10:
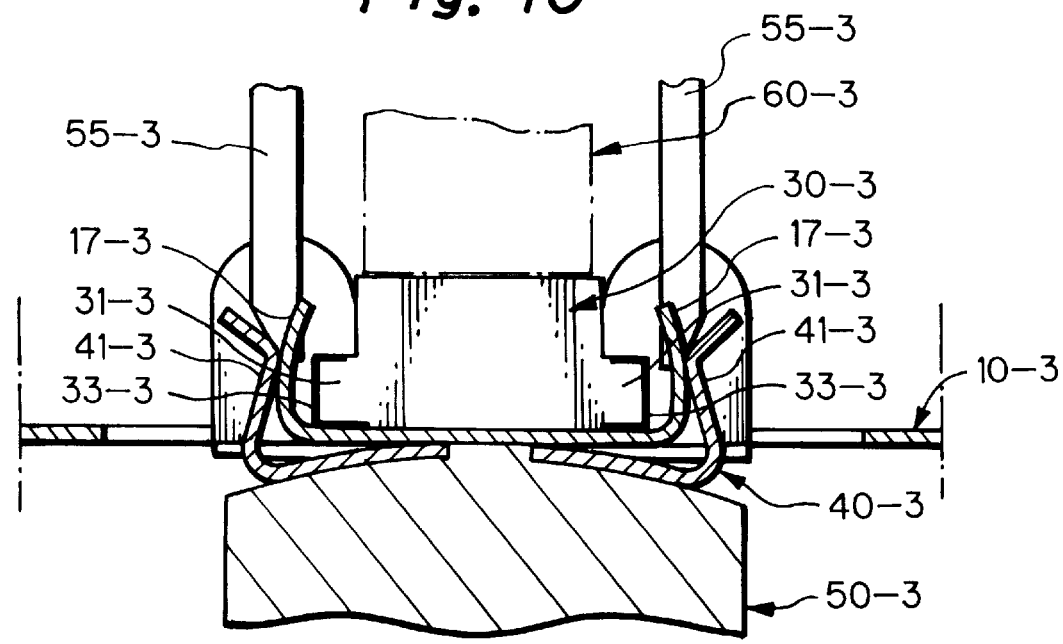
FIG. 10 is a side sectional view showing how the electronic component 30-3 is mounted on the flexible substrate 10-3 using the clamping member 40-3.
Figure 11:
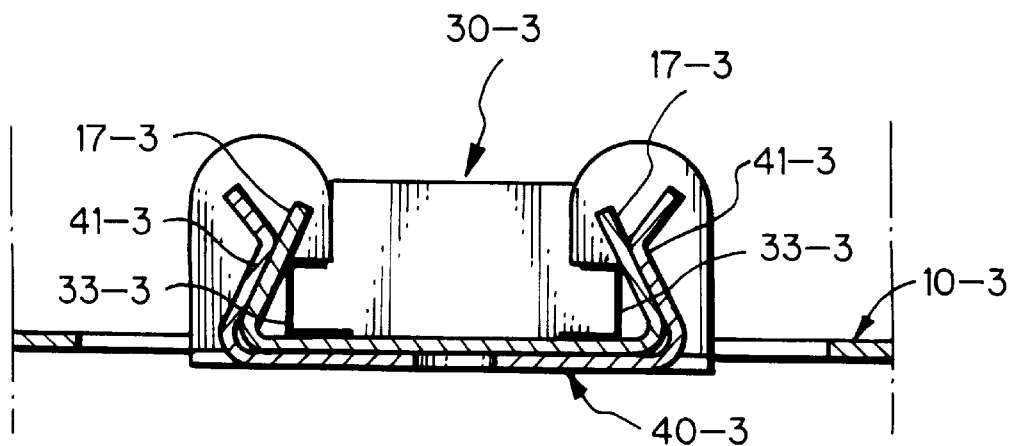
FIG. 11 is a side sectional view showing how the electronic component 30-3 is mounted on the flexible substrate 10-3 using the clamping member 40-3.

Then, the push-up member 50 is gradually pushed upwardly, as shown in FIG. 10. Since the head portion of the electronic component 30-3 is urged in the downward direction by means of a jig 60-3, the electrode pattern forming portions 17-3 and 17-3 are pushed upwardly by means of the clamping pieces 41-3 and 41-3, so as to be deflected to a position adjacent to a corresponding protrusion 31-3.

Since the clamping pieces 41-3 and 41-3 are opened, there is no risk for the electrode portions 33-3 and 33-3 of the electronic component 30-3 to be damaged. It is also noted that, since the head portion of the electronic component 30-3 is not excessively urged downwardly by means of the jig 60-3, there is no risk for the elements or devices within the electronic component 30-3 to be damaged.

When the presser protrusions 55-3 are moved upwardly and the push-up member 50-3 and the jig 60-3 are removed, the electronic component 30-3 is firmly and resiliently clamped by the clamping pieces 41-3 and 41-3 of the clamping member 40-3. By this, the electrode portions 33-3 and 33-3 of the electronic component 30-3 and the electrode pattern forming portions 17-3 and 17-3 of the flexible substrate 10-3 are firmly compressed and connected together, whereby mounting of the electronic component 30-3 is completed. At this time, the electrode patterns 13-3 and 13-3 (refer to FIG. 6) are urged against the electrode portion 33-3 and 33-3 respectively, so that the flexible substrate 10-3 and the electronic component 30-3 are electrically and mechanically secured together in a firm and stable manner.

With the mounting construction mentioned above, it may be possible for the electronic component 30-3 to be slid in directions (lateral direction) A shown by the arrow in FIG. 6, when an excessive force is applied to the electronic component in the directions A. It is noted, however, that, in the illustrated embodiment, the insulating layers 21-3 and 21-3 having a predetermined thickness are provided by printing at the locations where the electronic component 30-3 would be slid. Thus, the electronic component 30-3, which is strongly urged against the flexible substrate 10-3 by means of the clamping member 40-3, is unable to get over the predetermined thickness of the insulating layers 21-3 and 21-3, so that lateral sliding movement of the electronic component 30-3 is securely prevented.

The guide lugs 45-3 are provided for the two reasons mentioned below. First, the guide lugs 45-3 are contacted, on their outer surfaces, with the four outer edges 15a-3 (refer to FIG. 6) of the notches 15-3, so that the clamping member 40-3 may be maintained at an appropriate position at all times.

Secondly, the electronic component 30-3 or the clamping pieces 41-3 only are contacted with guide lugs 45-3, since the guide lugs 45-3 have a height greater than that of the electronic component 30-3 or the clamping pieces 41-3. Thus, the electronic component 30-3 or the clamping pieces 41-3 are not contacted by another member, whereby the electronic component 30-3 may be securely maintained in its mounted state.

[Fourth Embodiment]

Figure 12:
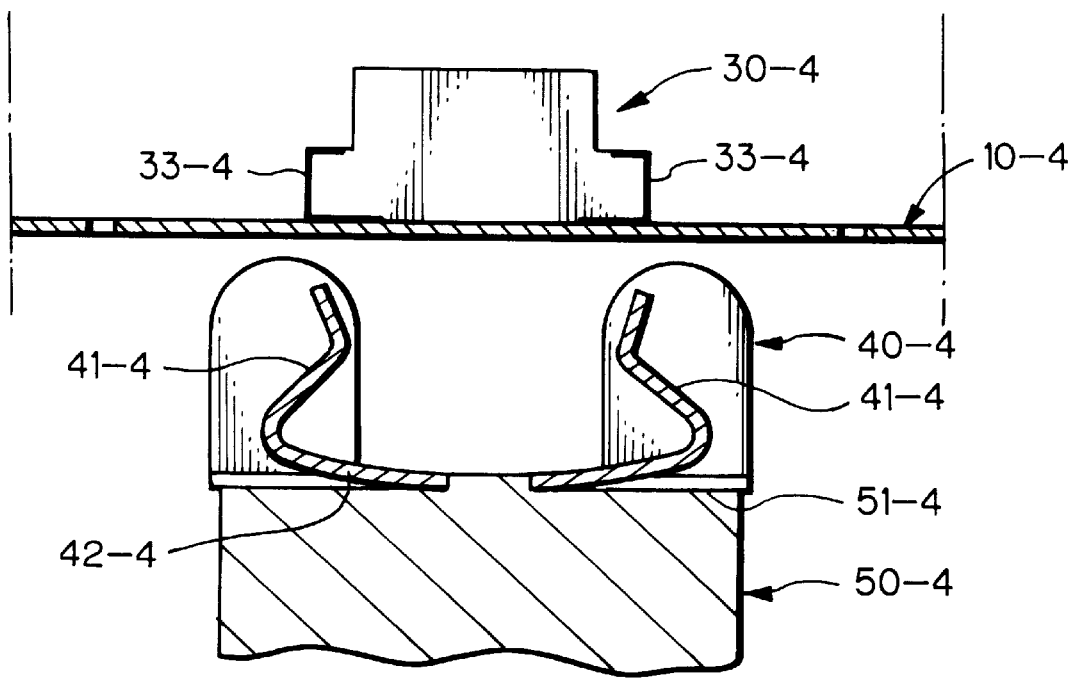
FIG. 12 is a view showing how an electronic component 30-4 is mounted on a flexible substrate 10-4 using a clamping member 40-4.
Figure 13:
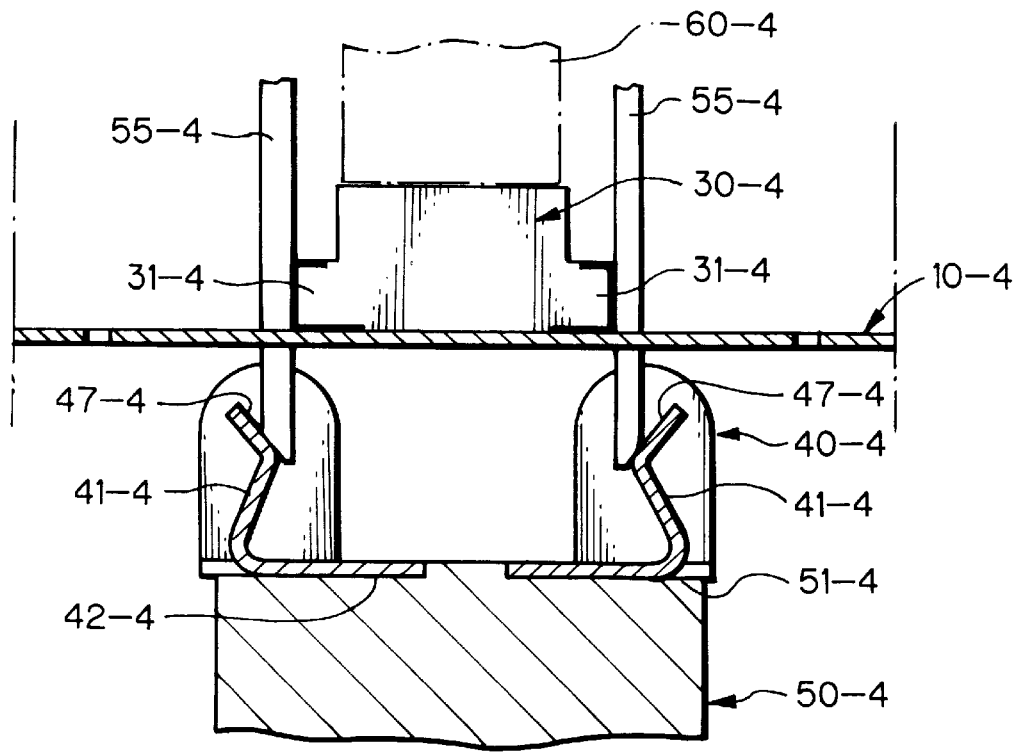
FIG. 13 is a view showing how the electronic component 30-4 is mounted on the flexible substrate 10-4 using the clamping member 40-4.
Figure 14:
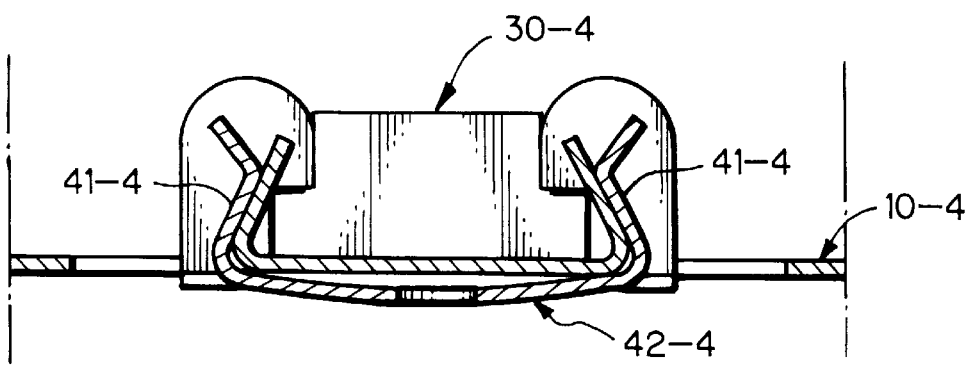
FIG. 14 is a view showing how the electronic component 30-4 is mounted on the flexible substrate 10-4 using the clamping member 40-4.

FIGS. 12 through 14 illustrate how an electronic component 30-4 is mounted on a flexible substrate 10-4 using a clamping member 40-4 according to a fourth embodiment of the invention.

The clamping member 40-4 according to this embodiment is only different from the third embodiment by the fact that the base portion 42-4 is preliminarily bent into a configuration so that its opposite ends are raised toward the upward direction, as shown in FIG. 12. Thus, the clamping pieces 41-4 and 41-4 are inclined more inwardly as compared with the third embodiment.

When the electronic component 30-4 is to be mounted on the flexible substrate 10-4 using the clamping member 40-4, the clamping member 40-4 placed on a push-up member 50-4 is first disposed just below the flexible substrate 10-4 on which the electronic component 30-4 is mounted. The upper surface 51-4 of the push-up member 50-4 is formed in a flattened shaped.

In a manner similar to that of the third embodiment, four presser portions 47-4 of the clamping member 40-4 are depressed by respective four presser protrusions 55-4 (only two rearward presser protrusions are shown in FIG. 13), as shown in FIG. 13. By this, the clamping pieces 41-4 and 41-4 are opened outwardly, so that the base portion 42-4 of the clamping member 40-4 is urged against the upper surface 51-4 of the push-up member 50-4 into a flattened configuration. Then, the push-up member 50-4 is gradually pushed upwardly while the electronic component 30-4 is maintained at a position by means of a jig 60-4. By this, the clamping pieces 41-4 and 41-4 in an opened state are located at positions opposite to the protrusions 31-4 and 31-4 of the electronic component 30-4. Then, the push-up member 50-4 and the presser protrusions 55-4 as well as the jig 60-4 are removed. By this, the electronic component 30-4 is firmly and securely held on the flexible substrate 10-4 by means of the clamping pieces 41-4 and 41-4, as shown in FIG. 14.

[Fifth Embodiment]

Figure 15:
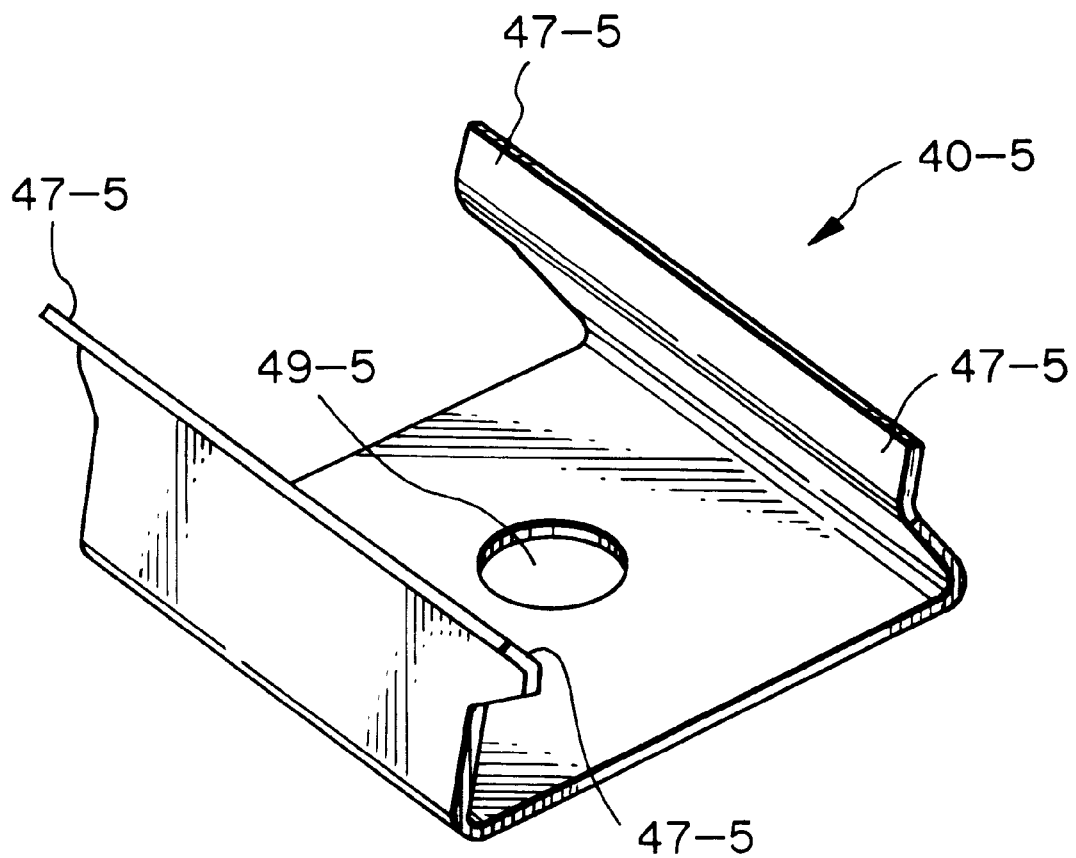
FIG. 15 is a perspective view showing a clamping member 40-5.

According to a fifth embodiment of the invention, a clamping member 40-5 may be provided, which includes, for example as shown in FIG. 15, presser portions 47-5 and a positioning hole 49-5, with the omission, for example, of the guide lugs 45-3 shown in FIG. 6.

[Sixth Embodiment]

Figure 16A:
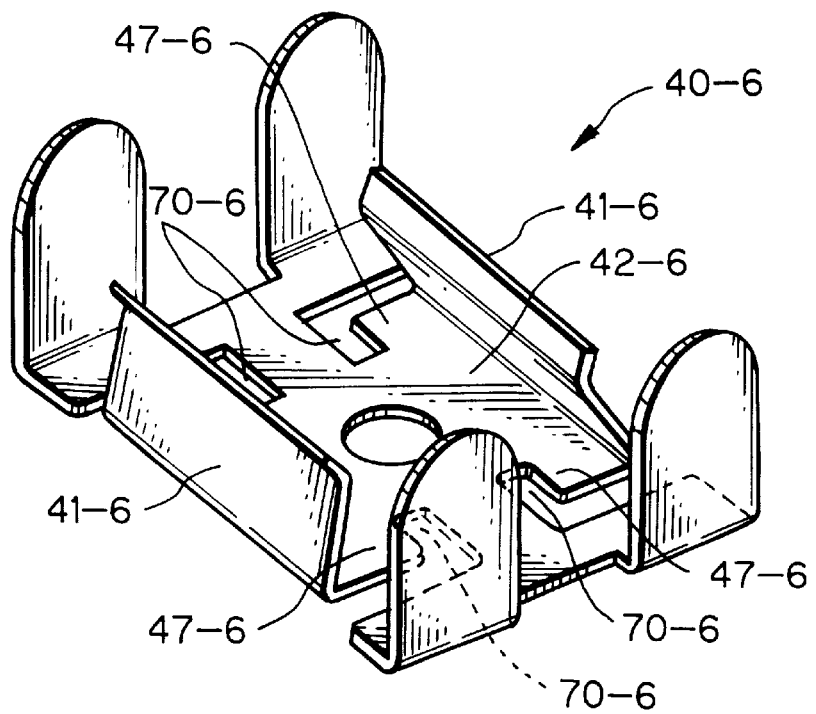
FIGS. 16(a) and 16(b) respectively are perspective and plan views showing a clamping member 40-6.
Figure 16B:
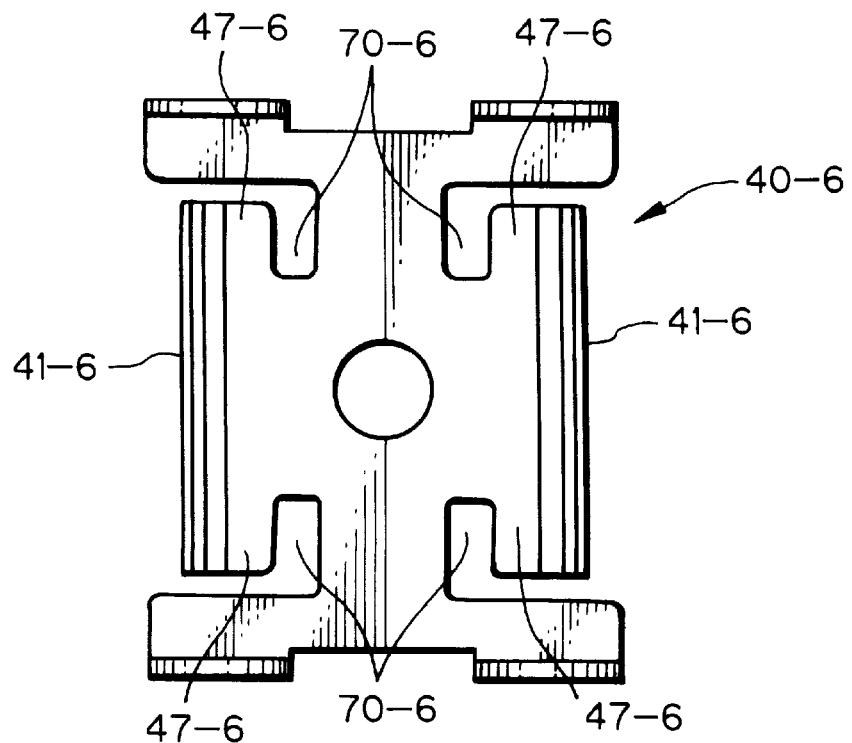

The position of the presser portions on the clamping member is not restricted to those shown in the above embodiments. The presser portions may be positioned desirably, provided that they are able to urge the clamping pieces into an opened configuration. Specifically, and as shown in FIG. 16, presser portions 47-6 may be provided at four corners of the base portion 42-6, in place of the presser portions provided on the clamping pieces 41-6 and 41-6. In this case, the clamping pieces 41-6 and 41-6 may be opened by depressing the presser portions 47-6. A notch 70-6 is formed at a position inward of each presser portion 47-6, so that the clamping pieces 41-6 and 41-6 may be easily opened.

[Seventh Embodiment]

Figure 17:
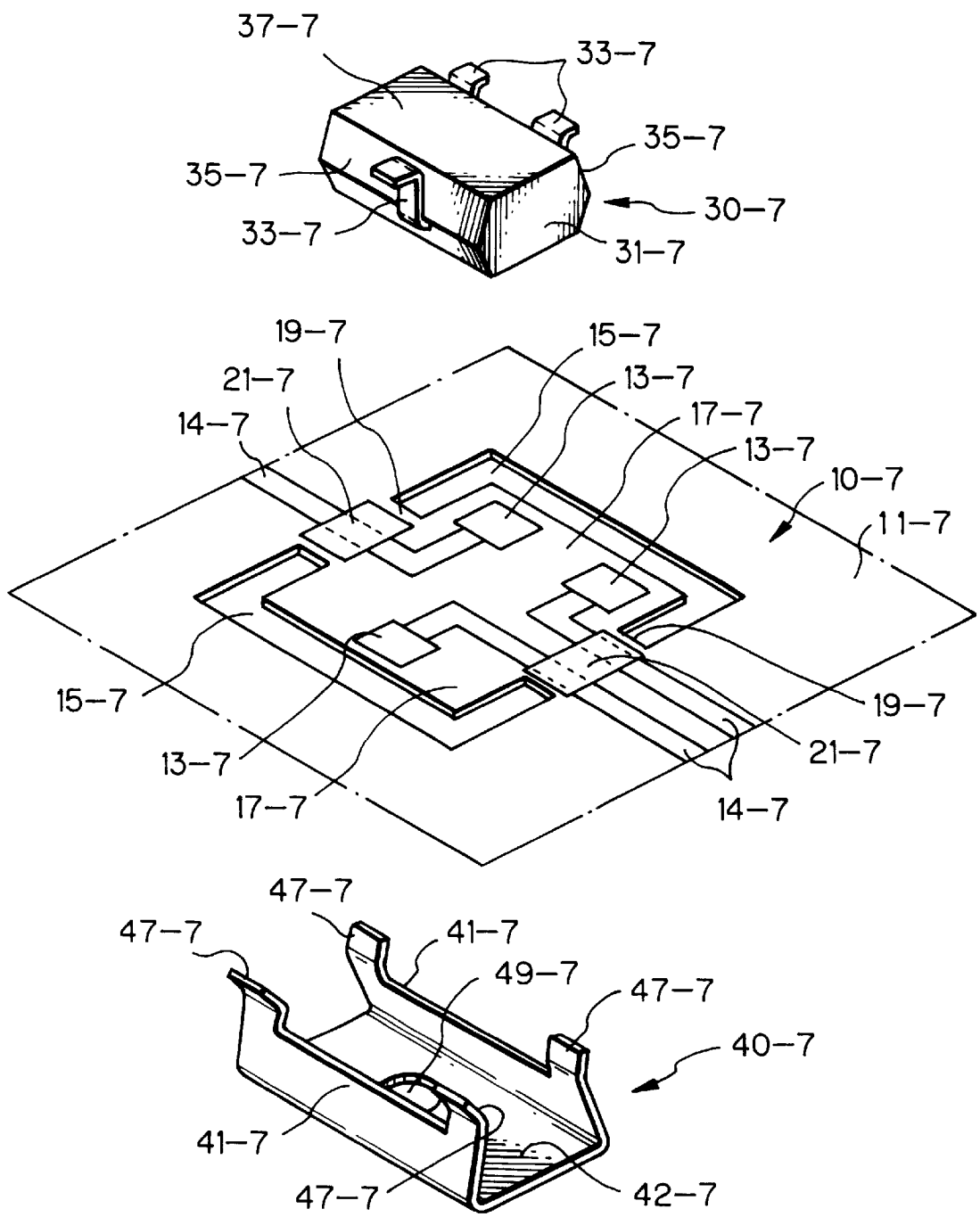
FIG. 17 is a schematic exploded perspective view showing a mounting construction according to a seventh embodiment of the invention in which an electronic component is mounted on a flexible substrate.

FIG. 17 is a schematic exploded perspective view showing a mounting construction in which an electronic component is mounted on a flexible substrate according to a seventh embodiment of the invention. In this embodiment, a flexible substrate 10-7 and an electronic component 30-7 are mechanically and electrically connected and secured together by means of a clamping member 40-7, as shown in FIG. 17. Each component part will be explained below.

The flexible substrate 10-7 includes a flexible sheet 11-7 made of a synthetic resin film (for example, PET film), and three electrode patterns 13-7 formed on the surface of the flexible sheet. A pair of notches 15-7 and 15-7 are formed, which circumscribe the periphery of the three electrode patterns 13-7, so as to form electrode pattern forming portions 17-7 and 17-7 of a tongue-like configuration.

It is noted that the electrode patterns 13-7 are formed, together with circuit patterns 14-7 leading out from the respective electrode patterns 13-7, by providing silver paste on the flexible sheet by screen printing.

Insulating layers 21-7 and 21-7 are formed on the connection portions 19-7 and 19-7 at the proximal portion of the notches 15-7 and 15-7 by means of a plurality of screen printing of insulating paint. The thickness of the insulating layers 21-7 and 21-7 is selected to be, for example, 100 micrometers.

The electronic component 30-7 according to the illustrated embodiment is a diode. In FIG. 17, the electronic component is shown in an up-side-down or inverted position. Specifically, the electronic component 30-7 includes a casing 31-7 of a substantially rectangular parallelopiped configuration, and three electrode portions 33-7 made of metal plate. One electrode portion is protruded from one outer surface of the casing, and the remaining two electrode portions are protruded from the other outer surface of the casing. More particularly, each electrode portion 33-7 is formed by bending the metal plate, which protrudes from the outer surface 35-7 of the casing 31-7, along the outer surface 35-7 of the casing 31-7 toward the lower surface 37-7 of the casing 31-7, and then bending it into a substantially normal angle, so that the forward end of the metal plate extends outwardly along a plane substantially the same as that of the lower surface 37-7 of the casing 31-7.

The clamping member 40-7 is formed from a resilient metal plate. Specifically, the opposite sides of the metal plate are bent into the upward direction, so as to form two clamping pieces 41-7 and 41-7 at opposite sides of the base portion 42-7. Presser portions 47-7 of a tongue-like configuration are formed at opposite ends of the upper side edge of each of the clamping pieces 41-7 and 41-7.

Each presser portion 47-7 is bent so that its forward end is directed outwardly. A positioning hole 49-7 is formed in the base portion 42-7 at its center.

Figure 18:
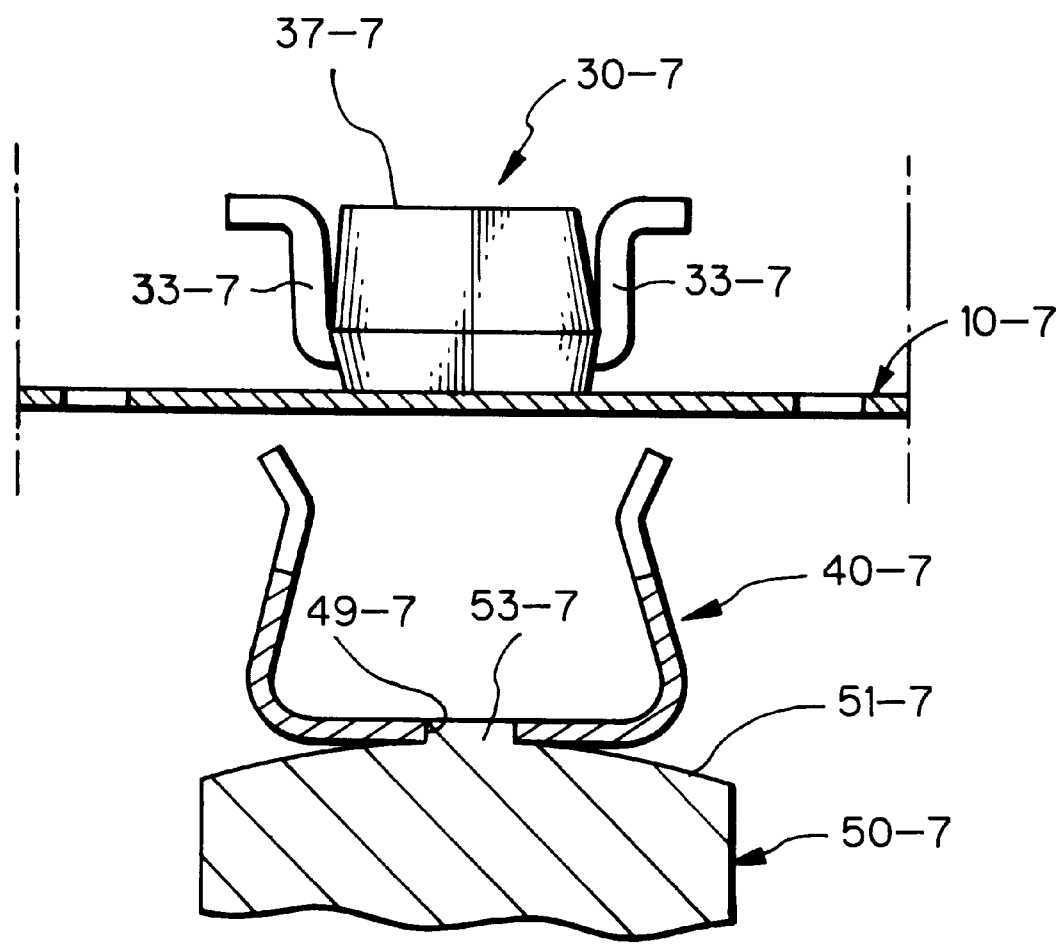
FIG. 18 is a side sectional view showing how an electronic component is mounted on a flexible substrate 10-7.

When the electronic component 30-7 is to be mounted on the flexible substrate 10-7, the electronic component 30-7 in its inverted position (i. e., the lower surface 37-7 is faced upwardly) is first placed on the flexible substrate 10-7, as shown in FIG. 18. At the same time, the clamping member 40-7 mounted on a push-up member 50-7 is disposed immediately below the portion of the flexible substrate 10-7 on which the electronic component 30-7 is mounted. It is noted that a circular protrusion 53-7 at the center of the push-up member 50-7 is preliminarily inserted into the positioning hole 49-7 of the clamping member 40-7.

The upper surface 51-7 of the push-up member 50-7 is curved into an arcuate configuration having a predetermined curvature.

Figure 19:
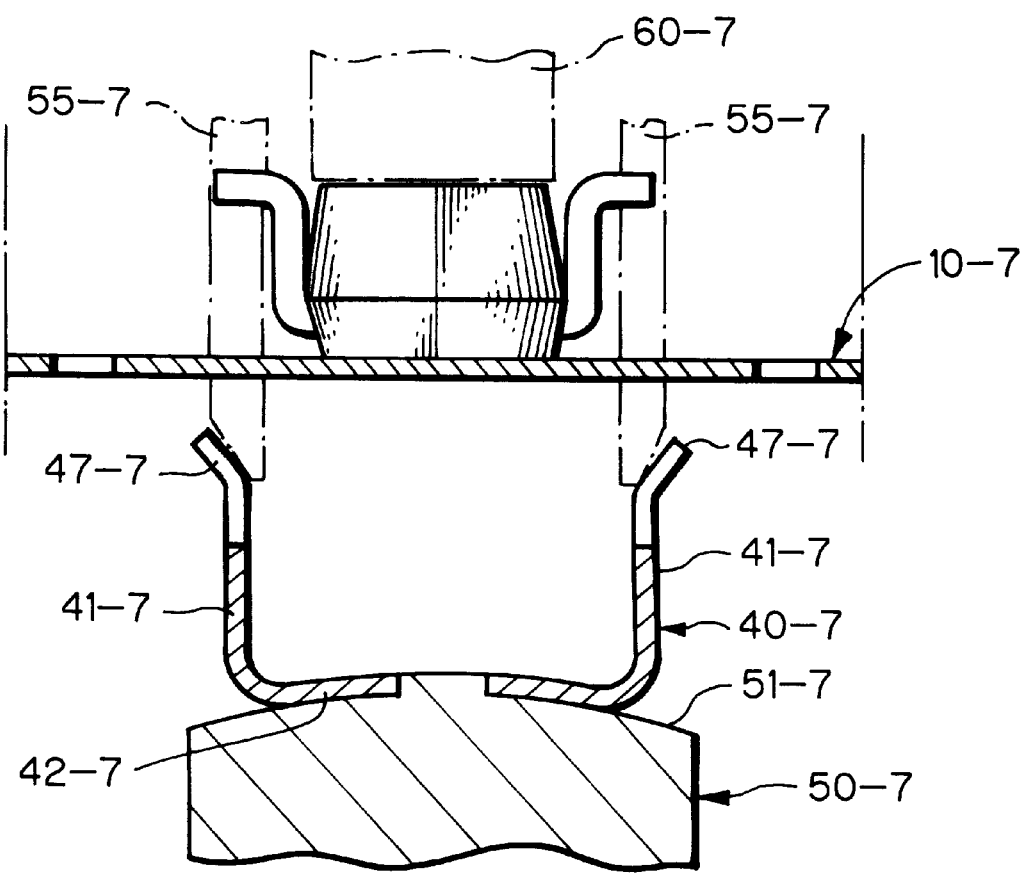
FIG. 19 is a side sectional view showing how the electronic component 30-7 is mounted on the flexible substrate 10-7.

Then, four presser protrusions 55-7 (only the rearward two are shown in FIG. 19) of a rod like configuration are passed through the notches 15-7 (refer to FIG. 17) from the upper side of the flexible substrate 10-7, as shown in FIG. 19. By this, the four presser portions 47-7 (refer to FIG. 17) of the clamping member 40-7 are depressed, so that the clamping pieces 41-7 and 41-7 are opened outwardly. At this time, the base portion 42-7 of the clamping member 40-7 is deflected into a configuration the same as that of the upper surface 51-7 of the push-up member 50-7.

Figure 20:
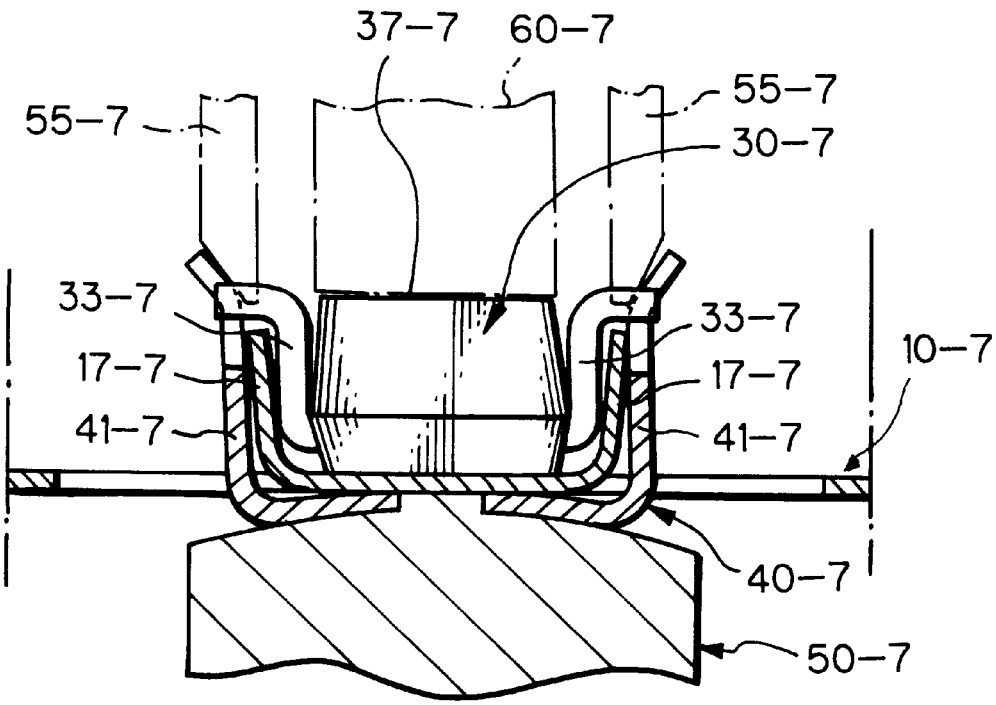
FIG. 20 is a side sectional view showing how the electronic component 30-7 is mounted on the flexible substrate 10-7.

In this state, the push-up member 50-7 is gradually pushed upwardly, as shown in FIG. 20. Since the inverted electronic component 30-7 is depressed on its lower surface 37-7 by a jig 60-7, the electrode pattern forming portions 17-7 and 17-7 are displaced upwardly and deflected by the clamping pieces 41-7 and 41-7, so as to be located at positions outward of the electrode portions 33-7 and 33-7 of the electronic component 30-7.

Since the clamping pieces 41-7 and 41-7 are opened, no excessive force is applied to the electrode portions 33-7 and 33-7, so that there is no risk of the electrode portions being damaged. It is also noted that, since the lower surface 37-7 of the electronic component 30-7 is not strongly depressed by the jig 60-7, there is no risk of elements or devices within the electronic component 30-7 being damaged. Specifically in the illustrated embodiment, the electronic component 30-7 is mounted in its inverted position. Thus, it is unnecessary for the protruding forward ends of the electrode portions 33-7 and 33-7 to get over the clamping pieces 41-7 and 41-7, so that the clamping pieces 41-7 and 41-7 need not to be significantly opened. Thus, mounting of the electronic component may be performed easily.

Figure 21:
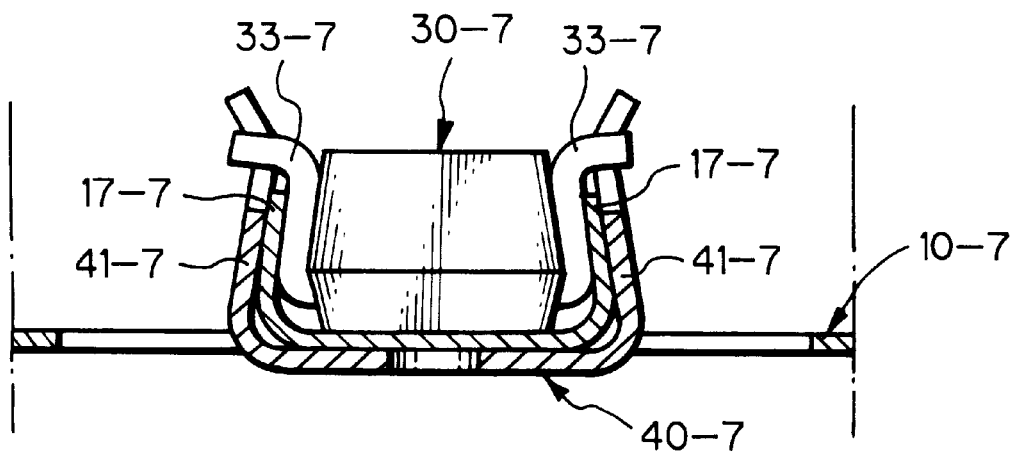
FIG. 21 is a side sectional view showing how the electronic component 30-7 is mounted on the flexible substrate 10-7.
Figure 22:
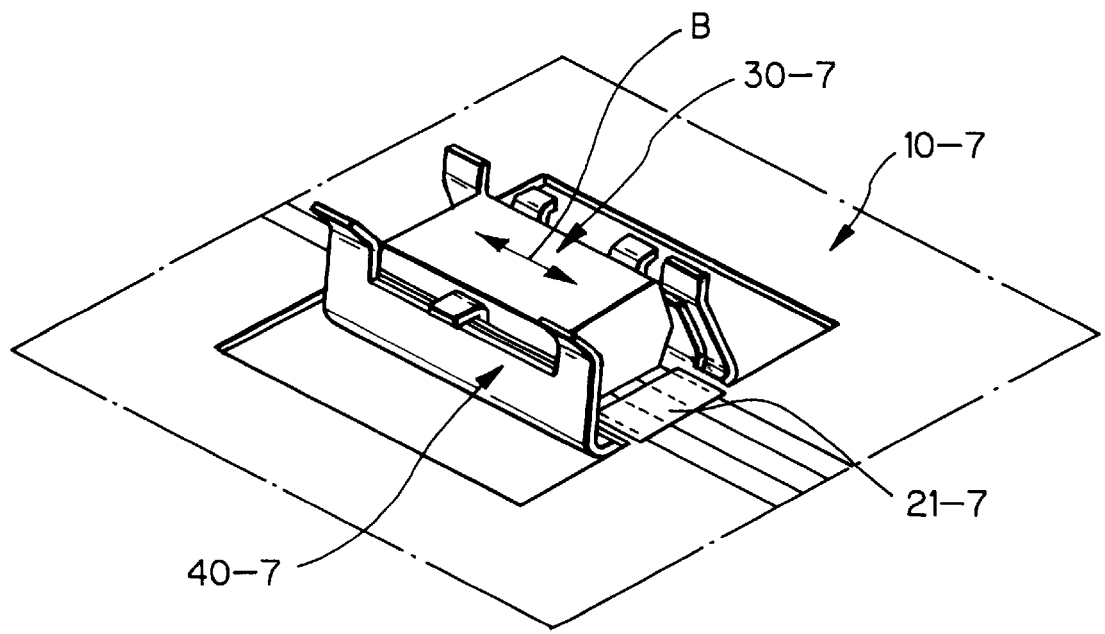
FIG. 22 is a perspective view showing the electronic component 30-7 having been mounted on the flexible substrate 10-7.

When the presser protrusions 55-7 are displaced upwardly and the push-up member 50-7 and the jig 60-7 are removed, the electronic component 30-7 is firmly and resiliently clamped by the clamping pieces 41-7 and 41-7 of the clamping member 40-7, as shown in FIGS. 21 and 22. By this, the electrode portions 33-7 and 33-7 of the electronic component 30-7 and the electrode pattern forming portions 17-7 and 17-7 of the flexible substrate 10-7 are strongly compressed and connected together, whereby mounting of the electronic component 30-7 is completed. At this time, the three electrode patterns 13-7 (see FIG. 17) are urged in surface-to-surface contact against the outer surface of the respective electrode portions 33-7. Thus, the flexible substrate 10-7 and the electronic component 30-7 are electrically and mechanically secured together in a firm and secure manner.

It is noted that, even when a strong force is applied to the electronic component 30-7 in the directions shown by the arrow B in FIG. 22, the electronic component 30-7, which is strongly urged against the flexible substrate 10-7 by the clamping member 40-7, is unable to get over the thickness of the insulating layers 21-7 and 21-7 which are printed on the portions at which the electronic component 30-7 tends to start sliding. Thus, lateral sliding movement of the electronic component 30-7 is positively prevented.

[Eighth Embodiment]

Figure 23:
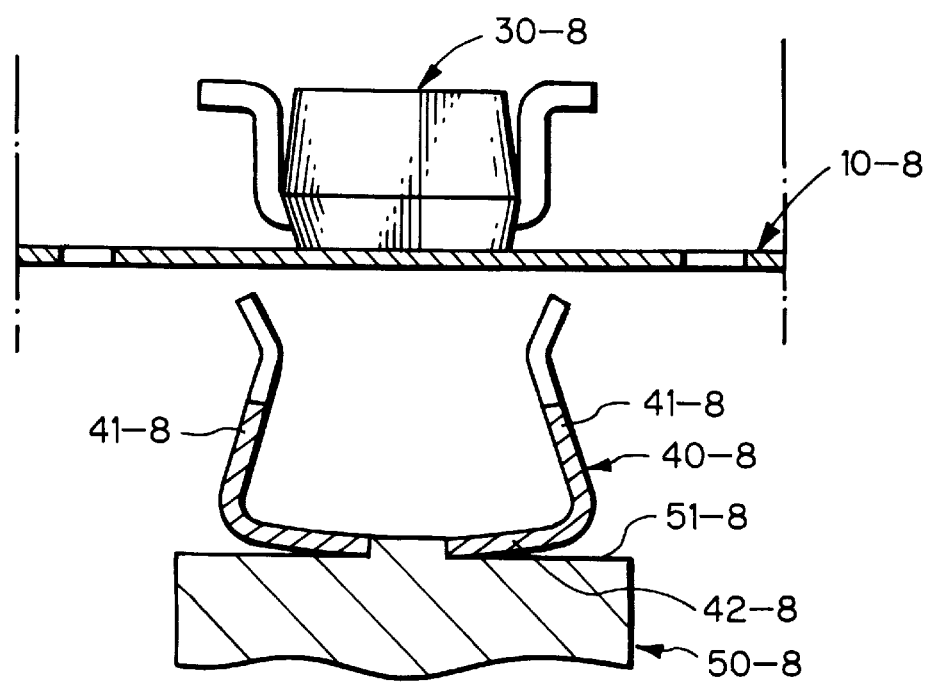
FIG. 23 is a side sectional view showing how an electronic component 30-8 is mounted on a flexible substrate 10-8 using a clamping member according to an eighth embodiment of the invention.
Figure 24:
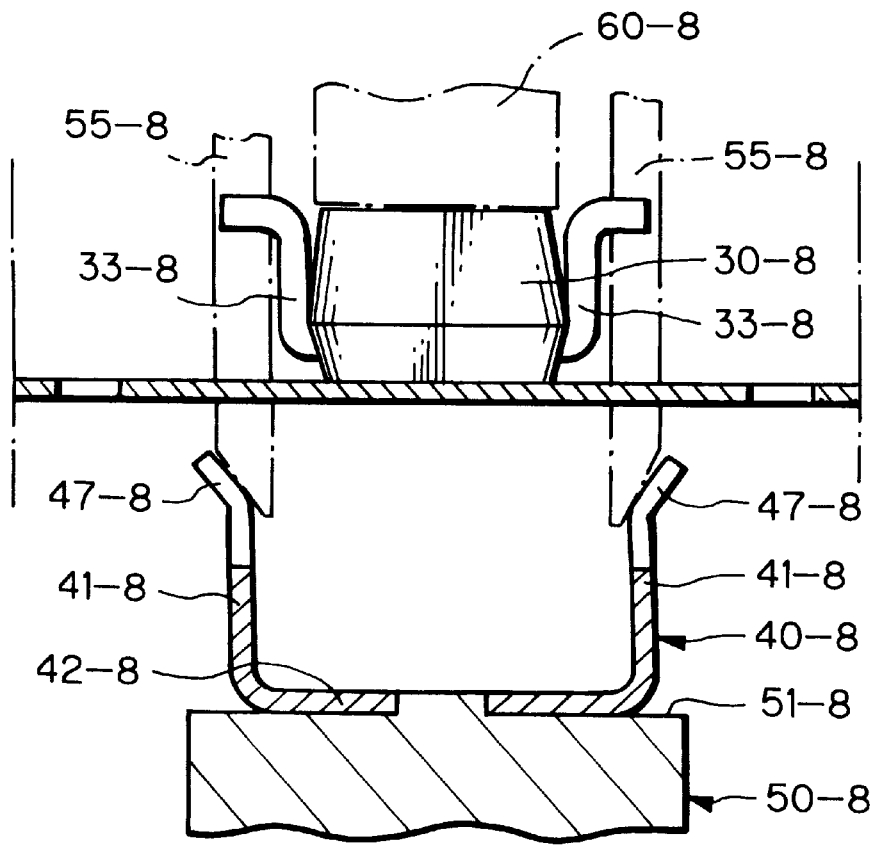
FIG. 24 is a side sectional view showing how the electronic component 30-8 is mounted on the flexible substrate 10-8.
Figure 25:
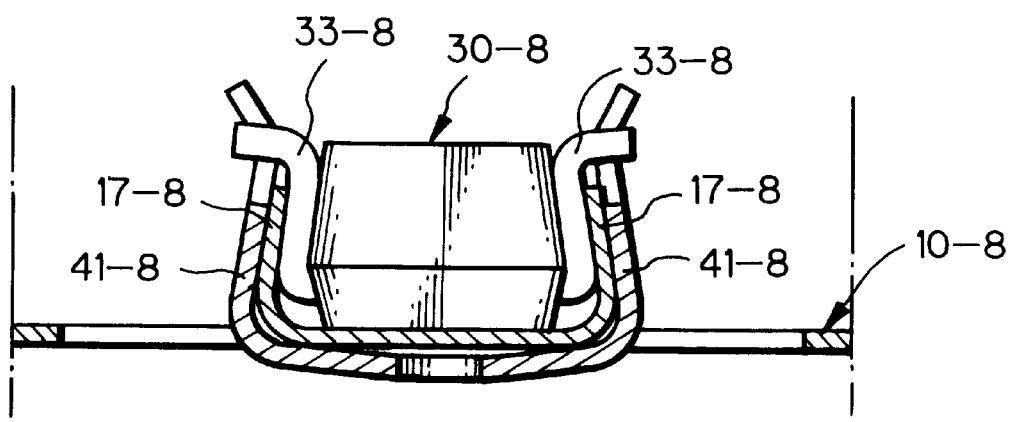
FIG. 25 is a side sectional view showing how the electronic component 30-8 is mounted on the flexible substrate 10-8.

FIGS. 23 through 25 illustrate how an electronic component 30-8 is mounted on a flexible substrate 10-8 using a clamping member 40-8 according to a eighth embodiment of the invention.

The clamping member 40-8 according to the illustrated embodiment is only different from the above-mentioned seventh embodiment by the fact that the base portion 42-8 is preliminarily bent into a curved configuration so that its opposite ends are raised upwardly, as shown in FIG. 23.

When the electronic component 30-8 is to be mounted on the flexible substrate 10-8 using the clamping member 40-8, the clamping member 40-8 placed on a push-up member 50-8 is disposed immediately below the flexible substrate 10-8 on which the inverted electronic component 30-8 is mounted. It is noted that the upper surface 51-8 of the push-up member 50-8 is configured into a flattened form.

As in the case of the seventh embodiment, four presser portions 47-8 of the clamping member 40-8 are displaced by four presser protrusions 55-8 (in FIG. 24, only the rearward two are shown), as shown in FIG. 24. By this, the clamping pieces 41-8 and 41-8 are opened outwardly, so that the base portion 42-8 of the clamping member 40-8 is urged against the upper surface 51-8 of the push-up member 50-8 into a flattened form. The push-up member 50-8 is gradually pushed upwardly, with the electrode component 30-8 being positioned by the jig 60-8, so that the opened clamping pieces 41-8 and 41-8 are located at positions outward of the corresponding electrode portions 33-8 and 33-8 of the electronic component 30-8. Then, the push-up member 50-8 and the presser protrusions 55-8, as well as the jig 60-8, are removed. By this, the electronic component 30-8 is firmly and positively secured to the flexible substrate 10-8 by means of the clamping pieces 41-8 and 41-8, as shown in FIG. 25.

[Ninth Embodiment]

Figure 26:
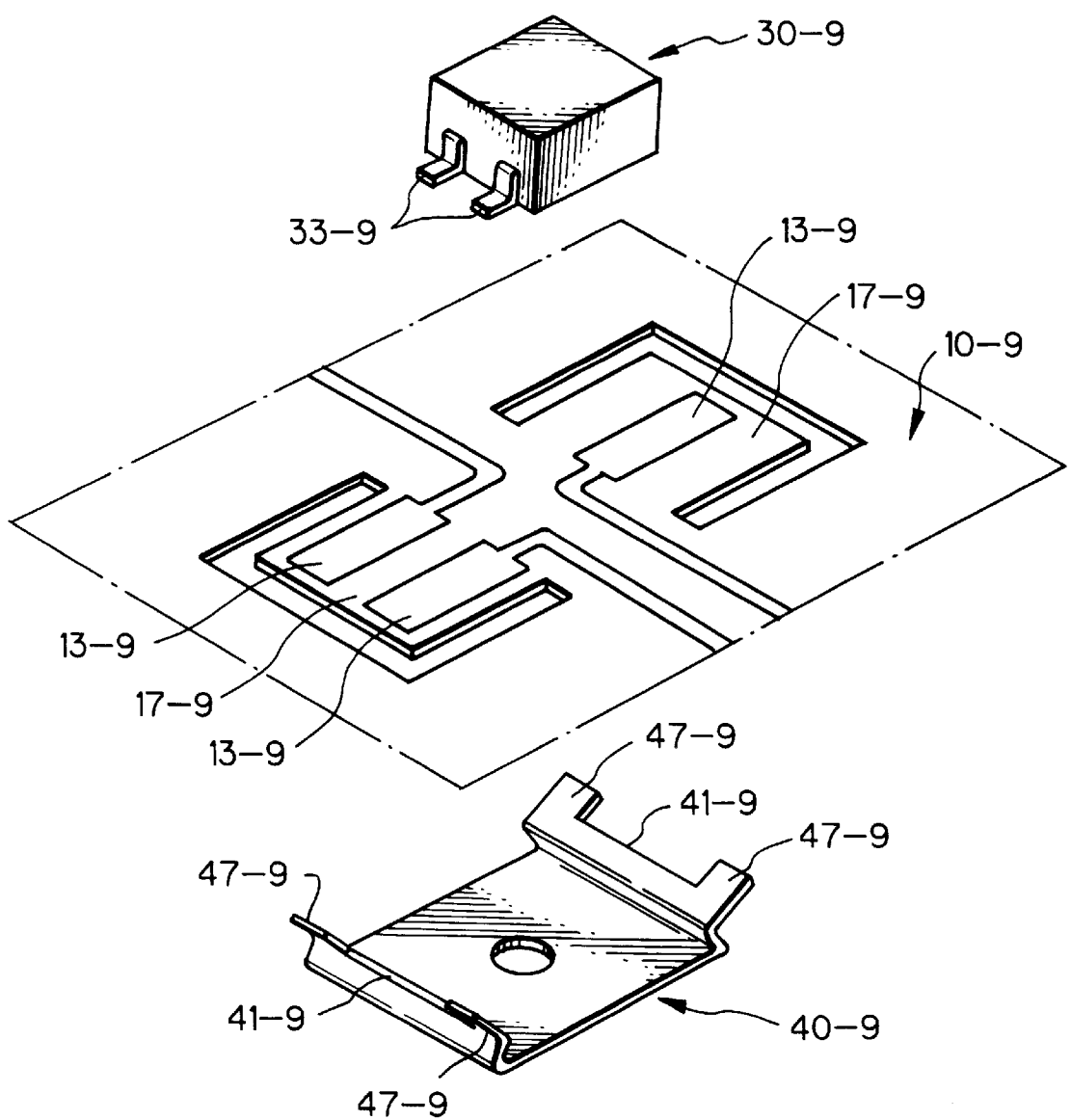
FIG. 26 is a schematic exploded perspective view showing a ninth embodiment of the invention.
Figure 27:
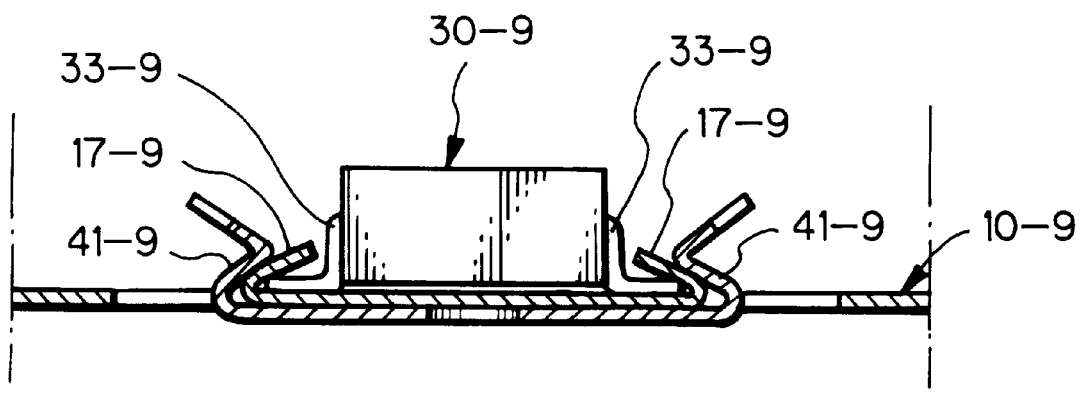
FIG. 27 is a side sectional view showing the ninth embodiment of the invention.

FIGS. 26 and 27 illustrate a ninth embodiment of the invention, wherein FIG. 26 is a schematic perspective view in an exploded fashion and FIG. 27 is a side sectional view in an assembled fashion.

In the illustrated embodiment, an electronic component 30-9 is mounted on a flexible substrate 10-9 in its normal posture, not an inverted posture. Thus, clamping pieces 41-9 and 41-9 of a clamping member 40-9 are sized and configured so as to cause electrode pattern forming portions 17-9 and 17-9 of the flexible substrate 10-9, as well as the forward ends of three electrode portions 33-9 (only two are shown in the figure) made of metal plate of the electronic component 30-9, to be clamped therebetween.

In the illustrated embodiment, presser portions 47-9 and 47-9 extending in a tongue like configuration are formed at opposite ends of the upper side of each of the clamping pieces.

When the electronic component 30-9 is to be mounted on the flexible substrate 10-9 using the claming member 40-9, the clamping member 40-9 placed on a push-up member (not shown) is first disposed immediately below the flexible substrate 10-9 on which the electronic component 30-9 is mounted. Then, the presser portions 47-9 are displaced by four presser protrusions (not shown), so as to cause the clamping pieces 41-9 and 41-9 to be opened outwardly. By this, the electrode pattern forming portions 17-9 and 17-9 are deflected by the clamping pieces 41-9 and 41-9, so that they are located at positions outward of the respective electrode portions 33-9 and 33-9. When the push-up member is removed, the electronic component 30-9 is firmly and positively secured to the flexible substrate 10-9 by means of the clamping pieces 41-9 and 41-9. At the same time, the electrode patterns 13-9 and the electrode portions 33-9 are electrically connected together.

[Tenth Embodiment]

Figure 28:
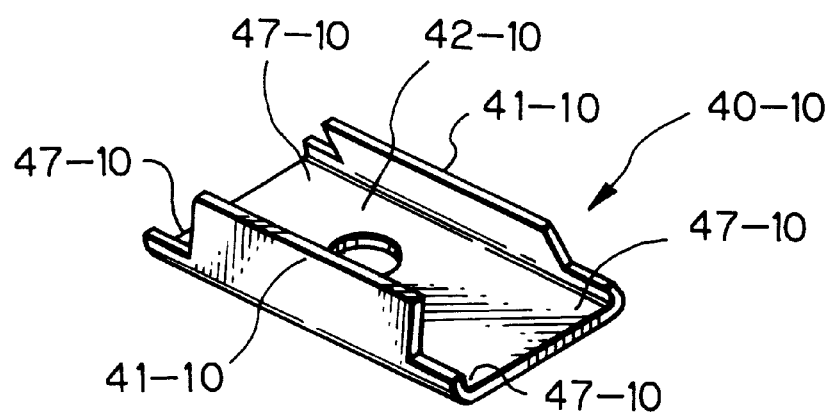
FIG. 28 is a perspective view showing a clamping member 40-10.

It is noted that position of the presser portions on the clamping member is not restricted to those shown in relation to the above-mentioned embodiments. For example, and as in the case of clamping member 40-10 shown in FIG. 28, a presser portion 47-10 may be provided at each corner of the base portion 42-10, in place of the presser portions provided on the clamping pieces 41-10 and 41-10. In this case, the clamping pieces 41-10 and 41-10 may be opened when the presser portions 47-10 are depressed.

[Eleventh Embodiment]

Figure 29:
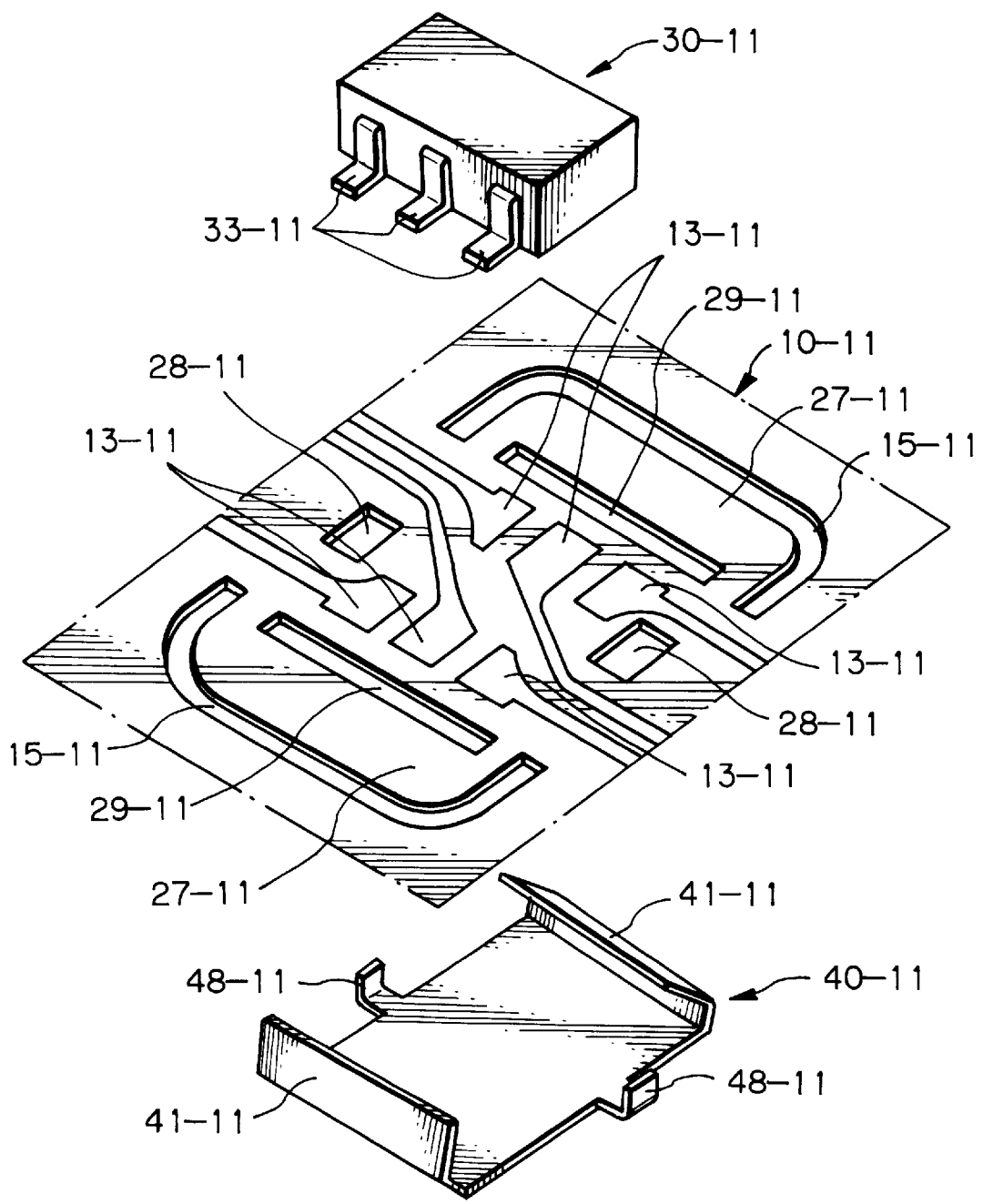
FIG. 29 is a schematic exploded perspective view showing a mounting construction according to an eleventh embodiment of the invention in which an electronic component is mounted on a flexible substrate.
Figure 30:
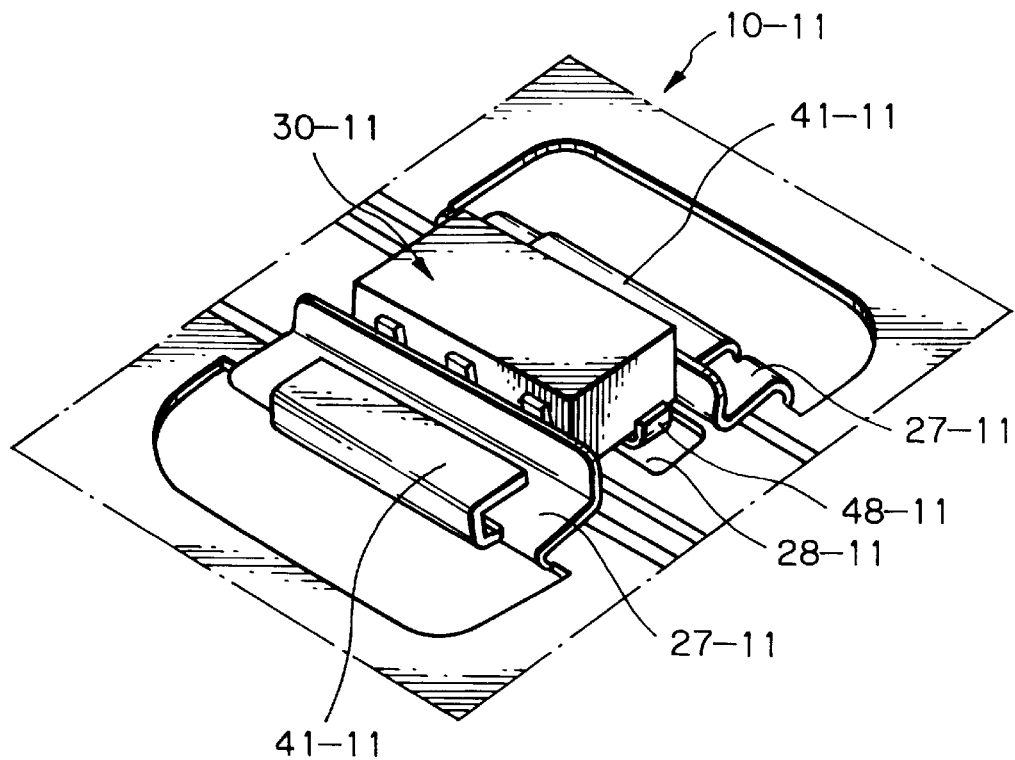
FIG. 30 is a schematic perspective view showing the mounting construction according to the eleventh embodiment of the invention in which an electronic component is mounted on a flexible substrate.
Figure 31:
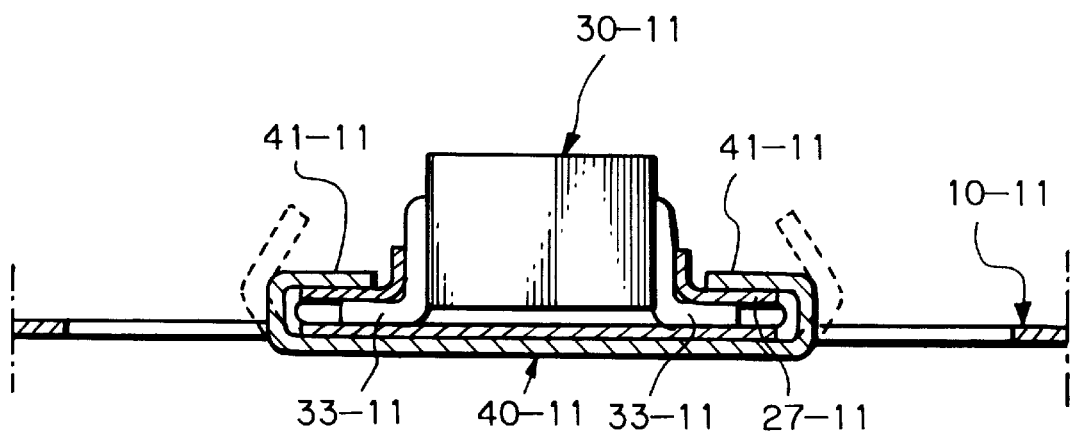
FIG. 31 is a schematic side sectional view showing the mounting construction according to the eleventh embodiment of the invention in which an electronic component is mounted on a flexible substrate.

FIG. 29 is a schematic exploded perspective view showing a mounting construction according to an eleventh embodiment of the invention in which an electronic component is mounted on a flexible substrate. FIGS. 30 and 31 are a schematic perspective view and a schematic side sectional view respectively showing the mounting construction according to the eleventh embodiment of the invention in which an electronic component is mounted on a flexible substrate. In this embodiment, a flexible substrate 10-11 and an electronic component 30-11 are mechanically and electrically connected and fixed with each other by means of a clamping member 40-11, as shown in FIG. 29.

Specifically, and in accordance with this embodiment, three left-hand side electrode portions 33-11 and three right-hand side electrode portions 33-11, each made of a metal plate, of the electronic component 30-11 are respectively placed on six electrode patterns 13-11 formed on the flexible substrate 10-11 by printing. Then, the flexible substrate 10-11 is placed on the clamping member 40-11. At this stage, bendable surfaces 27-11 and 27-11 formed by notches 15-11 and 15-11 in the flexible substrate 10-11 are bent in the upward direction by means of clamping pieces 41-11 and 41-11 on opposite ends of the clamping member 40-11. Since two slits 29-11 and 29-11 are formed in the flexible substrate 10-11, the bendable surfaces 27-11 and 27-11 may be easily bent. Then, the clamping pieces 41-11 and 41-11 are bent so as to be urged against the electrode portions 33-11, as shown in FIGS. 30 and 31. By this, the electrode portions 33-11 are clamped between the flexible substrate 10-11 and the bendable surfaces 27-11, so as to be mechanically secured. At the same time, the electrode portions 33-1 are urged against the electrode patterns 13-11, so as to be electrically connected therewith. It is noted that two small holes 28-11 are in the flexible substrate 10-11, such that two small protrusions 48-11 on the clamping member 40-11 may be forcibly inserted therein. The two small protrusions 48-11 are provided, in order to prevent the electronic component 30-11 from slidably moving in a direction in which it is not clamped or restricted by the clamping member 40-11.

The electronic component may be, for example, an electronic component having a function other than that shown in connection with the above-mentioned embodiments. It is also noted that various modifications may of course be made, for example, to the configuration of the electronic component, the number or configuration of the electrode portions, the configuration of the clamping member, and the configuration of the electrode patterns or the electrode pattern forming portions formed on the flexible substrate.

In the above-mentioned embodiments, silver paste printed on the substrate is used as electrode patterns. It is noted, however, that copper foils formed on the substrate by etching or the like may be used as the electrode patterns.

It is also noted that solder or adhesives additionally may be provided for reinforcing purposes.

The invention may be carried out in various ways without departing from the spirit or principal features of the invention. Thus, the aforementioned embodiments in all respects should be merely regarded as illustrative, but not restrictive. The scope of the invention is defined in the appended Claims and is not restricted by the description of the body of the specification. It is further noted that any variations and modifications falling within the scope of the Claims in terms of the doctrine of equivalents are within the purview of the invention.

What is claimed is:

1. A mounting construction comprising:

a flexible substrate including a flexible sheet having electrode patterns formed thereon, cut-out portions formed in said flexible substrate adjacent to said electrode patterns such that portions circumscribed by said cut-out portions comprise deflectable portions that can be deflected respect to other portions of said flexible substrate;

an electronic component having electrode portions to be connected to said electrode patterns;

a clamping member having clamping pieces for, with said electronic component being positioned on said flexible substrate, deflecting said deflectable portions to positions on and covering said electrode portions of said electronic component, and thereby clamping said deflectable portions against said electrode portions, whereby said electrode patterns of said flexible substrate are connected to said electrode portions of said electronic component.

2. A mounting construction as claimed in claim 1, wherein said flexible substrate has thereon, at at least one portion thereof other than said deflectable portions, an insulating layer that prevents lateral sliding movement of said electronic component relative to said flexible substrate.

3. A mounting construction as claimed in claim 1, wherein said clamping member has presser portions to be pressed to cause said clamping pieces to be urged to open positions thereof.

4. A mounting construction as claimed in claim 3, wherein said flexible substrate has thereon, at at least one portion thereof other than said deflectable portions, an insulating layer that prevents lateral sliding movement of said electronic component relative to said flexible substrate.

5. A mounting construction as claimed in claim 1, wherein said clamping member has guide lugs extending therefrom to project through said flexible substrate.

6. A mounting construction as claimed in claim 5, wherein said flexible substrate has thereon, at at least one portion thereof other than said deflectable portions, an insulating layer that prevents lateral sliding movement of said electronic component relative to said flexible substrate.

7. A mounting construction as claimed in claim 5, wherein said clamping member has presser portions to be pressed to cause said clamping pieces to be urged to open positions thereof.

8. A mounting construction as claimed in claim 7, wherein said flexible substrate has thereon, at at least one portion thereof other than said deflectable portions, an insulating layer that prevents lateral sliding movement of said electronic component relative to said flexible substrate.

9. A mounting construction as claimed in claim 1, wherein said clamping member comprises a resilient metal plate having opposite ends thereof bent to define said clamping pieces.

10. A mounting construction as claimed in claim 9, wherein said flexible substrate has thereon, at at least one portion thereof other than said deflectable portions, an insulating layer that prevents lateral sliding movement of said electronic component relative to said flexible substrate.

11. A mounting construction as claimed in claim 9, wherein said clamping member has presser portions to be pressed to cause said clamping pieces to be urged to open positions thereof.

12. A mounting construction as claimed in claim 11, wherein said flexible substrate has thereon, at at least one portion thereof other than said deflectable portions, an insulating layer that prevents lateral sliding movement of said electronic component relative to said flexible substrate.

13. A mounting construction as claimed in claim 9, wherein said clamping member has guide lugs extending therefrom to project through said flexible substrate.

14. A mounting construction as claimed in claim 13, wherein said clamping member has presser portions to be pressed to cause said clamping pieces to be urged to open positions thereof.

15. A mounting construction as claimed in claim 14, wherein said flexible substrate has thereon, at at least one portion thereof other than said deflectable portions, an insulating layer that prevents lateral sliding movement of said electronic component relative to said flexible substrate.

16. A mounting construction as claimed in claim 1, wherein each said deflectable portion comprises at least one of an electrode pattern forming portion on which is formed a respective said electrode pattern and a portion on which no electrode pattern is formed.

17. A mounting construction as claimed in claim 16, wherein said flexible substrate has thereon, at at least one portion thereof other than said deflectable portions, an insulating layer that prevents lateral sliding movement of said electronic component relative to said flexible substrate.

18. A mounting construction as claimed in claim 16, wherein said clamping member has presser portions to be pressed to cause said clamping pieces to be urged to open positions thereof.

19. A mounting construction as claimed in claim 18, wherein said flexible substrate has thereon, at at least one portion thereof other than said deflectable portions, an insulating layer that prevents lateral sliding movement of said electronic component relative to said flexible substrate.

20. A mounting construction as claimed in claim 16, wherein said clamping member has guide lugs extending therefrom to project through said flexible substrate.

21. A mounting construction as claimed in claim 20, wherein said flexible substrate has thereon, at at least one portion thereof other than said deflectable portions, an insulating layer that prevents lateral sliding movement of said electronic component relative to said flexible substrate.

22. A mounting construction as claimed in claim 20, wherein said clamping member has presser portions to be pressed to cause said clamping pieces to be urged to open positions thereof.

23. A mounting construction as claimed in claim 22, wherein said flexible substrate has thereon, at at least one portion thereof other than said deflectable portions, an insulating layer that prevents lateral sliding movement of said electronic component relative to said flexible substrate.

24. A mounting construction as claimed in claim 16, wherein said clamping member comprises a resilient metal plate having opposite ends thereof bent to define said clamping pieces.

25. A mounting construction as claimed in claim 24, wherein said flexible substrate has thereon, at at least one portion thereof other than said deflectable portions, an insulating layer that prevents lateral sliding movement of said electronic component relative to said flexible substrate.

26. A mounting construction as claimed in claim 24, wherein said clamping member has presser portions to be pressed to cause said clamping pieces to be urged to open positions thereof.

27. A mounting construction as claimed in claim 26, wherein said flexible substrate has thereon, at at least one portion thereof other than said deflectable portions, an insulating layer that prevents lateral sliding movement of said electronic component relative to said flexible substrate.

28. A mounting construction as claimed in claim 24, wherein said clamping member has guide lugs extending therefrom to project through said flexible substrate.

29. A mounting construction as claimed in claim 28, wherein said flexible substrate has thereon, at at least one portion thereof other than said deflectable portions, an insulating layer that prevents lateral sliding movement of said electronic component relative to said flexible substrate.

30. A mounting construction as claimed in claim 28, wherein said clamping member has presser portions to be pressed to cause said clamping pieces to be urged to open positions thereof.

31. A mounting construction as claimed in claim 30, wherein said flexible substrate has thereon, at at least one portion thereof other than said deflectable portions, an insulating layer that prevents lateral sliding movement of said electronic component relative to said flexible substrate.

* * * * *